US009923128B2

(12) United States Patent
Oh et al.

(10) Patent No.: US 9,923,128 B2
(45) Date of Patent: Mar. 20, 2018

(54) LIGHT EMITTING DEVICE PACKAGE AND BACKLIGHT UNIT HAVING THE SAME

(71) Applicant: LUMENS CO., LTD., Yongin-si, Gyeonggi-do (KR)

(72) Inventors: Seunghyun Oh, Gwangju-si (KR); Seunghoon Lee, Yongin-si (KR); Pyounggug Kim, Hwaseong-si (KR); Yungeon Cho, Osan-si (KR); Sungsik Jo, Yongin-si (KR); Jung-a Lim, Seoul (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/138,731

(22) Filed: Apr. 26, 2016

(65) Prior Publication Data
US 2016/0322544 A1   Nov. 3, 2016

Related U.S. Application Data

(63) Continuation of application No. 14/468,771, filed on Aug. 26, 2014, now Pat. No. 9,608,177.

(30) Foreign Application Priority Data

Aug. 27, 2013   (KR) .................. 10-2013-0101485
Aug. 27, 2013   (KR) .................. 10-2013-0101486
Oct. 10, 2013   (KR) .................. 10-2013-0120347

(51) Int. Cl.
*F21V 7/04*   (2006.01)
*H01L 33/52*   (2010.01)
(Continued)

(52) U.S. Cl.
CPC ............... *H01L 33/52* (2013.01); *F21V 5/04* (2013.01); *G02B 6/0073* (2013.01); *H01L 33/58* (2013.01);
(Continued)

(58) Field of Classification Search
CPC ....... G02B 6/003; G02B 6/0073; H01L 33/54; H01L 33/58; F21K 9/50; F21Y 2101/02
(Continued)

(56) References Cited

U.S. PATENT DOCUMENTS 7,115,979 B2 * 10/2006 Park .................. H01L 33/483
257/98
7,456,499 B2 * 11/2008 Loh ................... H01L 33/486
257/675

(Continued)

FOREIGN PATENT DOCUMENTS

JP      61-125066      6/1986
JP      3132536         6/2007
(Continued)

OTHER PUBLICATIONS

Korean Office Action dated Sep. 25, 2014 from Korean Patent Application No. 10-2013-0120347, 4 pgs.
(Continued)

*Primary Examiner* — Andrew Coughlin
(74) *Attorney, Agent, or Firm* — Mei & Mark LLP

(57) ABSTRACT

Provided are a light emitting device package in which lens tilting is prevented to reduce luminance and color deviations and a backlight unit having the same. The light emitting device package includes an encapsulation material disposed on a substrate to surround a light emitting device and a guide member disposed on the encapsulation material to guide an assembly path of a lens. The guide member includes a first inclined surface having a first inclination to guide a light incident part of the lens and a second inclined surface having a second inclination greater than the first inclination to further guide the light incident part of the lens.

12 Claims, 28 Drawing Sheets

(51) Int. Cl.
*H01L 33/58* (2010.01)
*F21V 5/04* (2006.01)
*F21V 8/00* (2006.01)
*F21Y 101/00* (2016.01)
*H01L 33/48* (2010.01)
*F21Y 115/10* (2016.01)

(52) U.S. Cl.
CPC ....... *F21Y 2101/00* (2013.01); *F21Y 2115/10* (2016.08); *H01L 33/486* (2013.01)

(58) Field of Classification Search
USPC .............................................. 362/311.02, 608
See application file for complete search history.

(56) References Cited

U.S. PATENT DOCUMENTS

| | | | | |
|---|---|---|---|---|
| 2003/0067264 A1* | 4/2003 | Takekuma | ............ | H01L 33/507 |
| | | | | 313/501 |
| 2005/0072981 A1* | 4/2005 | Suenaga | ............... | H01L 33/486 |
| | | | | 257/88 |
| 2005/0280014 A1* | 12/2005 | Park | ................... | H01L 33/483 |
| | | | | 257/98 |
| 2007/0045646 A1* | 3/2007 | Low | .................... | H01L 31/0203 |
| | | | | 257/98 |
| 2007/0267643 A1* | 11/2007 | Harada | ................... | H01L 33/58 |
| | | | | 257/98 |
| 2008/0012036 A1* | 1/2008 | Loh | ....................... | H01L 33/483 |
| | | | | 257/99 |
| 2008/0023711 A1* | 1/2008 | Tarsa | ................... | H01L 33/486 |
| | | | | 257/98 |
| 2009/0278153 A1* | 11/2009 | Cho | ....................... | H01L 33/58 |
| | | | | 257/98 |
| 2011/0075428 A1* | 3/2011 | Chen | ........................ | F21V 5/04 |
| | | | | 362/311.02 |
| 2012/0025236 A1* | 2/2012 | Galvez | ............... | H01L 25/0753 |
| | | | | 257/98 |

FOREIGN PATENT DOCUMENTS

| | | |
|---|---|---|
| JP | 2007-251214 | 9/2007 |
| JP | 2010085493 | 4/2010 |
| JP | 2013-505572 | 3/2011 |
| KR | 10-2005-0119546 | 12/2005 |
| KR | 10-2010-106297 | 10/2010 |
| KR | 10-2011-0109221 | 10/2011 |
| KR | 10-2012-70280 | 6/2012 |

OTHER PUBLICATIONS

Office Action dated Aug. 24, 2014 from Korean Patent Application No. 10-2013-0101486, 3 pgs.

* cited by examiner

LIGHT EMITTING DEVICE PACKAGE AND BACKLIGHT UNIT HAVING THE SAME

CROSS-REFERENCE TO RELATED APPLICATIONS

This application is a continuation of a U.S. patent application Ser. No. 14/468,771, filed on Aug. 26, 2014, which claims priority to Korean Patent Application Nos. 10-2013-0101485 filed on Aug. 27, 2013, 10-2013-0101486 filed on Aug. 27, 2017, and 10-2013-0203477 filed on Oct. 10, 2013, and all the contents of which are incorporated herein by reference in their entirety.

BACKGROUND

The present disclosure relates to a light emitting device package and a backlight unit having the same, and more particularly, to a light emitting device package in which lens tilting is prevented to reduce luminance and color deviations and a backlight unit having the same.

Light emitting diodes (LEDs) represent a kind of semiconductor device in which a PN-junction diode using a compound semiconductor is formed to constitute a light emitting source, thereby realizing light having various colors. Such a light emitting device may have a long life cycle, be miniaturized, and be lightweight. Also, since the light emitting device has good light orientation, the light emitting device may operate at a low voltage. Also, such an LED may have superior impact and vibration resistance, and a preheating time and complicated operation may be unnecessary. In addition, since the LED is packaged in various shapes, the LED may be modularized for various uses and thus be applied to lighting devices or display devices.

SUMMARY

In a direct type light emitting device package that is widely used for a backlight unit, light emitted from the light emitting device package may be primarily widely spared through a secondary lens so that the backlight unit is reduced in thickness, and also the light is uniformly emitted onto a light guide plate.

However, in the light emitting device package according to the related art, when the secondary lens is assembled, the secondary lens may be tilted to cause luminance and color deviations. Thus, light characteristics may be deteriorated due to the luminance and color deviations to significantly reduce uniformity of light emitted onto a light guide plate or display panel, thereby causing product defects.

To solve the above-described limitations, the present disclosure provides a light emitting device package in which a lens is easily aligned by using a guide member, a degree of precision in assembly of the lens is improved to prevent luminance and color deviations from occurring in a display device, thereby improving light characteristics and thus producing quality products, the lens is aligned in multistages to prevent the lens from being damaged, thereby easily aligning the lens, and an encapsulation material or substrate is completely inserted into a light incident part of the lens to realize slimness of the product, and a backlight unit having the same. However, this may be merely illustrative, and thus the present disclosure is not limited thereto.

In accordance with an embodiment, a light emitting device package may include: a substrate; a light emitting device disposed on the substrate; an encapsulation material disposed on the substrate and configured to surround the light emitting device; a guide member disposed on the encapsulation material and having at least one inclined surface to guide a light incident part of a lens; and the lens having at least one engaging surface to contact the guide member.

The guide member may include a top surface, and the at least one inclined surface includes a first inclined surface inclined to the top surface, and a second inclined surface inclined to the first inclined surface.

The guide member may further include a round edge disposed between the top surface and the first inclined surface.

The guide member may further include: a flat top surface and a bottom surface having an area larger than that of the top surface to contact the encapsulation material.

The guide member may further include: a top surface, a bottom surface configured to contact the encapsulation material, and a stopper configured to contact the at least one engaging surface of the lens.

The at least one engaging surface may include a bottom engaging surface which is supported by the stopper, and the stopper may be disposed to be more distant from a light axis of the light emitting device than the top surface.

The at least one engaging surface may include an inner engaging surface to contact the guide member, and the inner engaging surface may include an angle of inclination of about 90° with respect to the substrate.

The lens may further comprise a part fixed to the substrate. The lens may be disposed to be more distant from the light axis of the light emitting device than the guide member.

In accordance with another embodiment, a backlight unit may include: an encapsulation material disposed on a substrate to surround a light emitting device; a guide member disposed on the encapsulation material to guide an assembly path of a lens; and a light guide plate disposed in a path of light emitted from the light emitting device, wherein the guide member includes: a first inclined surface having a first inclination to guide a light incident part of the lens; and a second inclined surface having a second inclination greater than the first inclination to further guide the light incident part of the lens.

In accordance with yet another embodiment, a light emitting device package may include: a substrate, a light emitting device disposed on the substrate, an encapsulation material disposed on the substrate and configured to surround the light emitting device, and at least one guide member having at least one inclined surface to guide a light incident part of a lens. The at least one inclined surface may be formed at a side surface of the encapsulation material, the lens may have a light incident part which is an inner hollow portion, and the light incident part may have an engaging surface to contact the encapsulation material and the substrate.

The at least one inclined surface may include: a first inclined surface inclined to a top surface of the encapsulation material, and a second inclined surface inclined to the first inclined surface.

The engaging surface may include an inner engaging surface of which an angle of inclination is about 90° with respect to the substrate.

The substrate may further include a side surface engaging with the engaging surface.

The lens may further include a bottom surface disposed at a same level as a bottom surface of the substrate.

In accordance with still another embodiment, a light emitting device package may include: a substrate, a light emitting device disposed on the substrate, a lens having a light incident part which is an inner hollow portion, and a guide member having at least one inclined surface to guide the light incident part of the lens. The guide member may be configured to be snap-fitted into the light incident part.

The at least one inclined surface may include a first inclined surface inclined downward toward the substrate, and a second inclined surface inclined to the first inclined surface.

The light emitting device package may further include an encapsulation material disposed on the substrate and configured to surround the light emitting device, and the guide member may be formed on the encapsulation material.

In accordance with still another embodiment, a light emitting device package may include: an encapsulation material disposed on a substrate to surround a light emitting device; and at least one guide member disposed on a side surface of the encapsulation material to contact the lens and guide an assembly path of the lens.

The encapsulation material may be a plate having a substantially circular shape or a plate having a substantially quadrangular shape with rounded corners, and the guide member may be integrally molded with the encapsulation material and may be a side surface portion of the encapsulation material that is completely inserted into the light incident part of the lens.

The guide member may include a first inclined surface portion having a first inclined surface to guide the light incident part of the lens; a second inclined surface portion having an inclined surface that is relatively sharply inclined when compared to the first inclined surface portion to further guide the light incident part of the lens; and a contact part having a contact surface that the light incident part of the lens finally contacts and is fixed thereof.

The first inclined surface portion may have an inclined internal angle of about 100° to about 150° with respect to the top surface portion, and the second inclined surface portion may have an inclined internal angle of about 150° to about 175° with respect to the first inclined surface portion.

The light emitting device package may further include a substrate on which the light emitting device is seated, the substrate supporting the encapsulation material; and at least one substrate guide part disposed on a side surface of the substrate to guide to guide an assembly path of the lens.

The substrate may be a plate having a substantially circular shape or a plate having a substantially quadrangular shape with rounded corners, and the substrate guide part may be a substrate guide side surface portion that is completely inserted into the light incident part of the lens.

A hook surface portion corresponding to the hook part disposed on the light incident part of the lens may be disposed on the substrate guide part or the encapsulation guide part.

BRIEF DESCRIPTION OF THE DRAWINGS

Embodiments can be understood in more detail from the following description taken in conjunction with the accompanying drawings, in which.

DETAILED DESCRIPTION OF EMBODIMENTS

Figure 1:
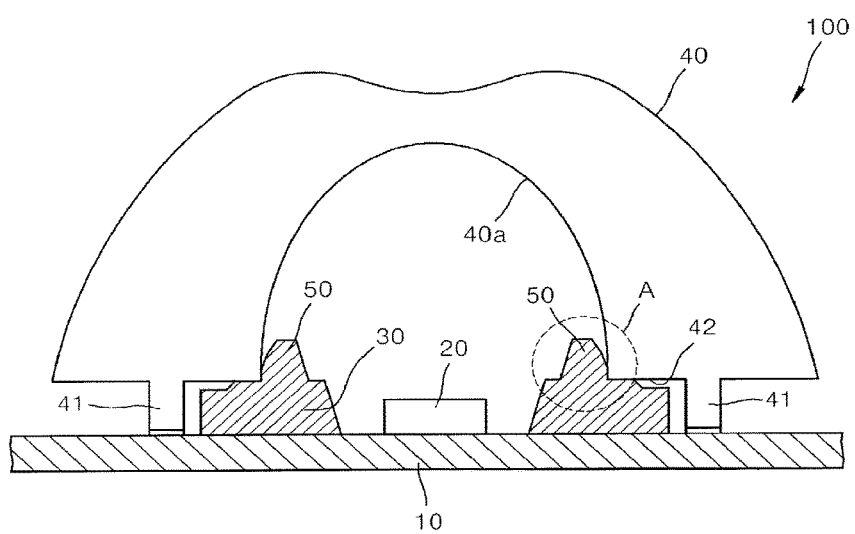
FIG. 1 is a cross-sectional view of a light emitting device package in accordance with an embodiment.

Hereinafter, several embodiments of the present disclosure will be described in detail with reference to the accompanying drawings.

The embodiments of the present disclosure are provided to more fully describe the present disclosure to those of ordinary skill in the art. The following embodiments may be modified to various types and the scope of the present disclosure is not limited to the following embodiments. Rather, these embodiments are provided so that this disclosure will be thorough and complete, and will fully convey the spirit of the present disclosure to those skilled in the art. Also, in the figures, a thickness or dimension of each of layers is exaggerated for clarity of illustration.

It will be understood that it is referred to as being "on," "connected to", "stacked", or "coupled to" another element, it may be directly on, connected, stacked, or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

As used herein, terms such as "first," "second," etc. are used to describe various members, components, regions, layers, and/or portions. However, it is obvious that the members, components, regions, layers, and/or portions should not be defined by these terms. The terms do not mean a particular order, up and down, or superiority, and are used only for distinguishing one member, component, region, layer, or portion from another member, component, region, layer, or portion. Thus, a first member, component, region, layer, or portion which will be described may also refer to a second member, component, region, layer, or portion, without departing from the teaching of the present disclosure.

Spatially relative terms, such as "above" or "upper" and "below" or "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the term "above" may encompass both an orientation of above and below. The device may be otherwise oriented (rotated at 90 degrees or at other orientations) and the spatially relative descriptors used herein will be interpreted accordingly.

The terms used herein are for illustrative purposes of the present disclosure only and should not be construed to limit the meaning or the scope of the present disclosure. As used in this specification, a singular form may, unless definitely indicating a particular case in terms of the context, include a plural form. Also, the expressions "comprise" and/or "comprising" used in this specification neither define the mentioned shapes, numbers, steps, operations, members, elements, and/or groups of these, nor exclude the presence or addition of one or more other different shapes, numbers, steps, operations, members, elements, and/or groups of these, or addition of these. The term "and/or" used herein includes any and all combinations of one or more of the associated listed items.

Hereinafter, embodiments of the present disclosure will be described with reference to the attached drawings that schematically illustrate the ideal embodiments of the present disclosure. In the drawings, for example, according to the manufacturing technology and/or tolerance, the modification of the illustrated shape may be expected. Thus, the embodiments of the present disclosure must not be interpreted to be limited by a particular shape that is illustrated in the drawings and must include a change in the shape occurring, for example, during manufacturing.

Figure 2:
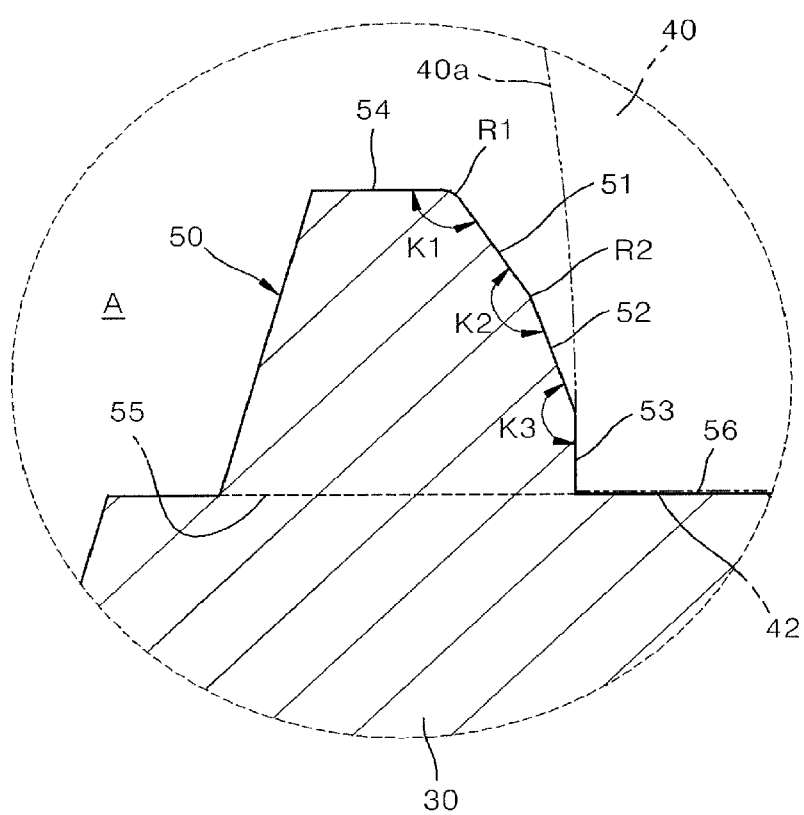
FIG. 2 is an enlarged view of a portion A of FIG. 1.
Figure 3:
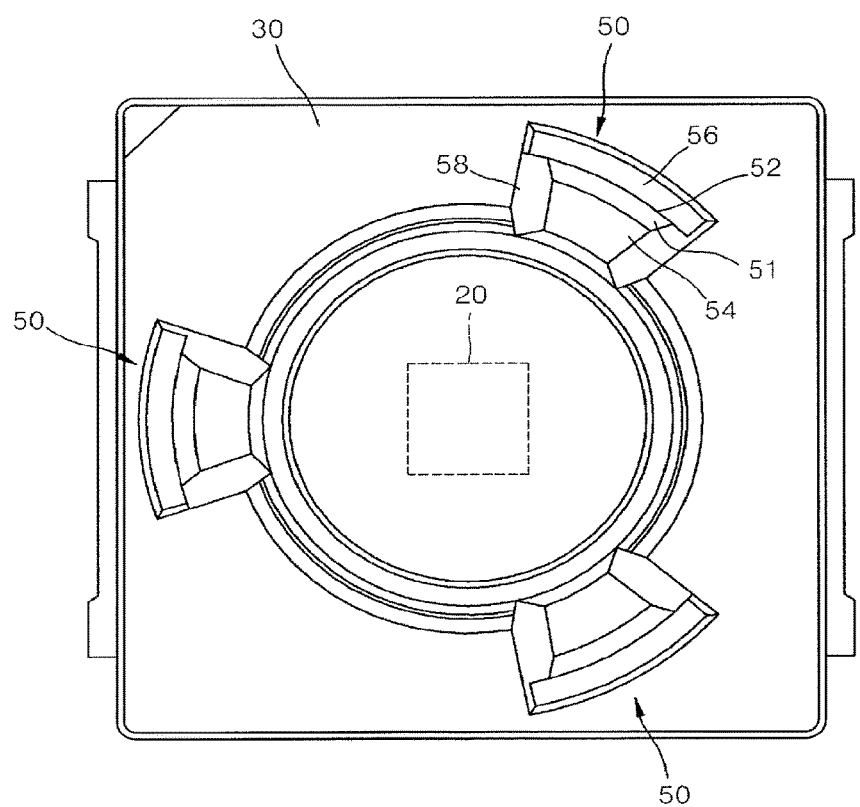
FIG. 3 is a plan view illustrating an example of the light emitting device package of FIG. 1.
Figure 4:
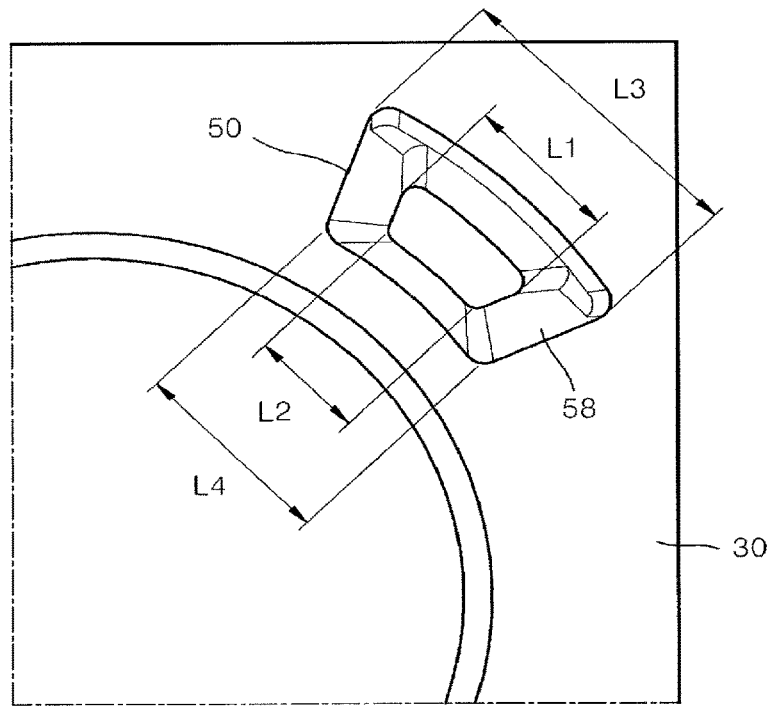
FIG. 4 is an enlarged view of a guide member of FIG. 3.
Figure 5:
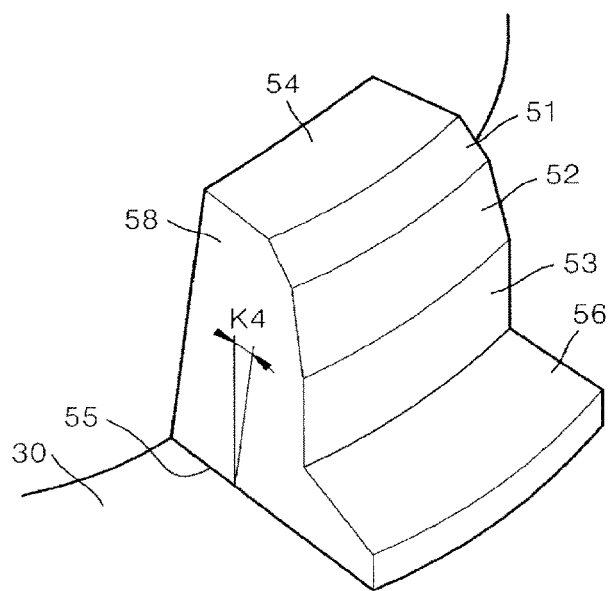
FIG. 5 is a perspective view illustrating an example of the guide member of FIG. 1.

FIG. 1 is a cross-sectional view of a light emitting device package in accordance with an embodiment, FIG. 2 is an enlarged view of a portion A of FIG. 1, FIG. 3 is a plan view illustrating an example of the light emitting device package of FIG. 1, FIG. 4 is an enlarged view of a guide member of FIG. 3, and FIG. 5 is a perspective view illustrating an example of the guide member of FIG. 1.

Referring to FIGS. 1 to 5, a light emitting device package 100 in accordance with an embodiment may include a substrate 10, a light emitting device 20, an encapsulation material 30, and a guide member 50.

Here, the light emitting device 20 may be mounted on and electrically connected to the substrate 10. Thus, the substrate 10 may be formed of a conductive material having proper mechanical strength and insulation to support the light emitting device 20.

For example, the substrate 10 may be a printed circuit board (PCB) on which various wiring layers for connecting the light emitting device 20 to an external power source are formed and which is multilayered by using an epoxy-based resin sheet. Also, the substrate 10 may be a flexible PCB formed of a soft material.

Alternatively, the substrate 10 may be a synthetic resin substrate such as a resin, glass epoxy, etc., or a ceramic substrate in consideration of thermal conductivity. In addition, the substrate 10 may be an insulated metallic substrate such as aluminum, copper, zinc, tin, lead, gold, silver, or the like. Also, the substrate 10 may be a plate-shaped or lead frame-shaped substrate.

Also, the light emitting device 20 may be seated on the substrate 10. In FIG. 1, the substrate 10 on which one light emitting device 20 is seated is illustrated as an example.

Alternatively, a plurality of light emitting devices 20 may be seated on the substrate 10.

The light emitting device 20 may comprise a semiconductor. For example, the light emitting device 20 may include a blue, green, red, or yellow LEDs comprising a nitride semiconductor or an ultraviolet (UV) LED. The nitride semiconductor may have a composition formula of $Al_xGa_yIn_zN$ ($0 \leq x \leq 1$, $0 \leq y \leq 1$, $0 \leq z \leq 1$, $x+y+z=1$).

Also, the light emitting device 20 may be formed by epitaxial growing the nitride semiconductor such as InN, AlN, InGaN, AlGaN, or InGaAlN on a growth sapphire substrate or silicon carbide substrate through vapor deposition, for example, metal organic chemical vapor deposition (MOCVD). Also, the light emitting device 20 may be formed by using a semiconductor such as ZnO, ZnS, ZnSe, SiC, GaP, GaAlAs, or AlInGaP in addition to the nitride semiconductor. The semiconductor may be formed by using a stacked body including an n-type semiconductor layer, a light emitting layer, and a p-type semiconductor layer, which are successively stacked. The light emitting layer (an active layer) may be formed by using a stacked semiconductor having a multi quantum well (MQW) structure or a single quantum well structure or a stacked semiconductor having a double hetero structure. Also, the light emitting device 20 may selectively emit light having a predetermined wavelength according to a use of a display or lighting.

Here, an insulation, conductive, or semiconductor substrate may be used as the growth substrate if necessary. For example, the growth substrate may be formed of sapphire, SiC, Si, $MgAl_2O_4$, MgO, $LiAlO_2$, $LiGaO_2$, or GaN. For example, to epi-grow a GaN material, the GaN substrate that is a homo structure may be used. However, the GaN substrate may have difficulty in manufacture and have high production costs.

Thus, the sapphire or silicon carbide (SiC) substrate that is a hetero substrate may be mainly used. Here, the sapphire substrate may be more widely used instead of the SiC substrate that is relatively high in price. When the hetero substrate is used, a defect such as dislocation due to a lattice constant between a substrate material and a thin film material may increase. Also, when a temperature changes, substrate warpage may occur due to a difference in thermal expansion coefficient between the substrate material and the thin film material to cause cracks in a thin film. Here, the occurrence of the above-described limitation may be reduced by using a buffer layer disposed between the substrate 10 and a GaN-based light emitting stacked body S.

Also, the growth substrate may be completely or partially removed or patterned during a chip manufacturing process to improve light or electrical characteristics of the LED chip before or after being grown to an LED structure.

For example, in the case of the sapphire substrate, laser may be irradiated onto an interface between the substrate and the semiconductor layer to separate the substrate from the semiconductor layer. Also, the silicon or silicon carbide substrate may be reduced through a polishing/etching process.

Also, when the growth substrate is removed, the other substrate may be used. A support substrate may be bonded by using a reflection metal, or a reflection structure may be inserted into a center of the bonding layer to improve light efficiency of the LED chip disposed at a side opposite to the original growth substrate.

Also, the growth substrate may be patterned to form an unevenness or inclined surface on a main surface (a surface or both side surfaces) or side surface of the substrate before or after being grown to the LED structure, thereby improving light extraction efficiency. The pattern may have a size of about 5 nm to about 500 μm. Here, the pattern may be regularly or irregularly formed to improve the light extraction efficiency. Also, the pattern may have various shapes such as pillar, mountain, hemispherical, and polygonal shapes.

The sapphire substrate may be formed of a crystal having Hexa-Rhombo R3c symmetry. The sapphire substrate may have a lattice constant of 13.001 Å along a C-axis and a lattice constant of 4.758 Å along an A-axis. Also, orientation planes of the sapphire substrate may include a C(0001) plane, an A(1120) plane, an R(1102) plane, and the like. In this case, the C(0001) plane is mainly used as a nitride growth substrate because it relatively facilitates the growth of a nitride film and is stable at a high temperature.

Also, the Si substrate may be exemplified as another example of the growth substrate. The Si substrate may be suitable for large-sized substrates and have a relatively low price to improve mass production. There is a demand for establishment of a technology to suppress an occurrence of crystal defects due to a difference in lattice constant of about 17% between the Si substrate having a plane (111) and GaN. Also, there is a demand for establishment of a technology to suppress the wafer warpage that occurs due to a difference in thermal expansion rate of about 56% between Si and GaN. The cracks in the GaN thin film may occur due to the wafer warpage. Also, the process control may be difficult to cause a limitation in which dispersion in light emitting wavelength within the same wafer increases.

Also, since the Si substrate absorbs light emitted from the GaN-based semiconductor to reduce external quantum efficiency of the light emitting device, the substrate may be removed as occasion demands, and a support substrate such as Si, Ge, SiAl, ceramic, or metal substrate including a reflection layer may be additionally formed.

When the GaN thin film is grown on the hetero substrate such as the Si substrate, dislocation density may increase due to mismatch in lattice constant between the substrate material and the thin film material, and the cracks and warpage may occur due to a difference in thermal expansion coefficient between the substrate material and the thin film material. To prevent the dislocation and cracks of the light emitting stacked body, a buffer layer may be disposed between the growth substrate and the light emitting stacked body. The buffer layer may adjust a bent degree of the substrate when the active layer is grown to reduce the wavelength dispersion of the wafer.

Here, the buffer layer may be formed of a semiconductor material having a compositional formula of $Al_xIn_yGa_{1-x-y}N$ ($0 \leq x \leq 1$, $0 \leq y \leq 1$, $x+y \leq 1$), particularly, GaN, AlN, AlGaN, InGaN, or InGaNAlN. As occasion demands, the buffer layer may be formed of a material such as $ZrB_2$, $HfB_2$, ZrN, HfN, or TiN. Also, a plurality of layers may be combined with each other to form the buffer layer, or the composition of the buffer layer may gradually change.

Also, although not shown, the light emitting device 20 may include a flip chip-shaped light emitting device having a signal transmission medium such as a bump, pad, or solder. Alternatively, the light emitting device 20 may include various light emitting devices such as vertical type and horizontal type light emitting devices having a signal transmission medium such as a wire.

Also, the encapsulation material 30 may be disposed on the substrate 10 and have a through-hole to surround the light emitting device 20. As illustrated in FIG. 3, the through-hole of the encapsulation material 30 may have, for example, a circular shape. In addition, the through-hole may have various shapes such as a quadrangular shape, an oval shape, a polygonal shape, a trapezoid shape, and a combined shape.

Also, the encapsulation material 30 may be formed of at least one material selected from an epoxy molding compound (EMC), an EMC containing at least reflection material, white silicon containing a reflection material, a photo solder resister (PSR), and a combination thereof.

Also, the encapsulation material 30 may be molded, dispensed, or screen-printed on the substrate 10.

More particularly, for example, the encapsulation material 30 may be formed of an epoxy resin composition, a silicon resin composition, a modified epoxy resin composition such as a silicone modified epoxy resin composition, a modified silicon resin composition such as an epoxy modified silicon resin, a polyimide resin composition, a modified polyimide resin composition, or a resin such as polyphthalamide (PPA), a polycarbonate resin, poly(phenylene sulfide) (PPS), a liquid crystal polymer (LCP), an ABS resin, a phenol resin, an acrylic resin, and a PBT resin.

Also, titanium oxide, silicon dioxide, titanium dioxide, zirconium dioxide, potassium titanate, alumina, aluminum nitride, boron nitride, mullite, chrome, or a light reflective material such as a white-based or metal-based component may be contained in the resin.

Figure 9:
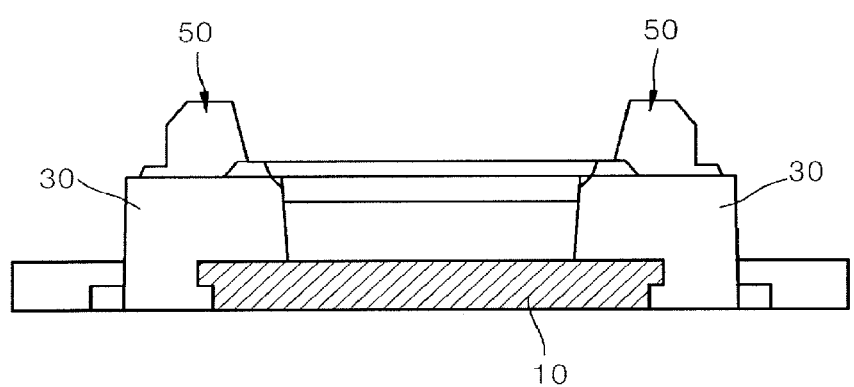
FIG. 9 is a cross-sectional view illustrating another example of the light emitting device package of FIG. 1.

As illustrated in FIG. 9, the encapsulation material 30 may have various shapes. Thus, the shape of the encapsulation material 30 of the light emitting device package 100 in accordance with an embodiment is not limited to that illustrated in FIG. 1.

The guide member 50 may be disposed on the encapsulation member 30 to guide an assembly path of a lens 40. The guide member 50 may include a first inclined surface 51, a second inclined surface 52, a contact surface 53, a top surface 54, a bottom surface 55, and a stopper 56.

Here, as illustrated in FIG. 2, the first inclined surface 51 is a portion having a relatively gentle inclination to guide a light incident part 40a of the lens 40.

Also, the second inclined surface 52 is continuously disposed on the first inclined surface 51 to further guide the light incident part 40*a* of the lens 40 and has a second inclination steeper than that of the first inclination.

Also, the contact surface 53 is continuously disposed on the second inclined surface 52 to finally contact and be fixed to the light incident part 40*a* of the lens 40, i.e., an inner engaging surface 42' of the lens 40. Thus, the contact surface 53 may have a contact portion. Here, the contact surface 53 may have an inclined angle of about 90° with respect to an assembly direction toward the lens 40. The lens 40 may have an engaging surface and the inner engaging surface 42' is one example of the engaging surface.

The top surface 54 is a flat portion at which the first inclined surface 51 starts, and the bottom surface 55 is a portion at which the contact surface 53 is ended.

Here, the bottom surface 55 may have an area greater than that of the top surface 54. As illustrated in FIGS. 1 to 5, for example, the guide member 50 of the light emitting device package 100 in accordance with an embodiment may generally have a wide lower portion and a narrow upper portion.

Also, as illustrated in FIG. 2, the first inclined surface 51 may have an inclined internal angle K1 of about 100° to about 135° with respect to the top surface 54, the second inclined surface 52 may have an inclined internal angle K2 of about 150° to about 175° with respect to the first inclined surface 51, and the contact surface 53 may have an inclined internal angle K3 greater than at least the inclined internal angle K2 with respect to the second inclined surface 52 so that the guide member 50 guides the light incident part 40*a* of the lens 40 in a primarily gentile inclined direction and then in a secondarily significantly inclined direction when the light incident part 40*a* of the lens 40 is guided.

Also, as illustrated in FIG. 2, a edge R1 between the top surface 54 and the first inclined surface 51 and a edge R2 between the first inclined surface 51 and the second inclined surface 52 may be roundly chamfered to prevent the component from being damaged when the light incident part 40*a* of the lens 40 collides with the components.

Also, as illustrated in FIG. 2, the stopper 56 may be connected to the contact surface 53 and be in contact with a bottom surface or a bottom engaging surface 42 of the light incident part 40*a* of the lens 40. Thus, the stopper 56 may determine an assembly position of the light incident part 40*a* of the lens 40.

Also, as illustrated in FIG. 3, three guide members 50 may be integrally molded with the encapsulation material 30 to protrude in a direction toward the lens 40.

Figure 10:
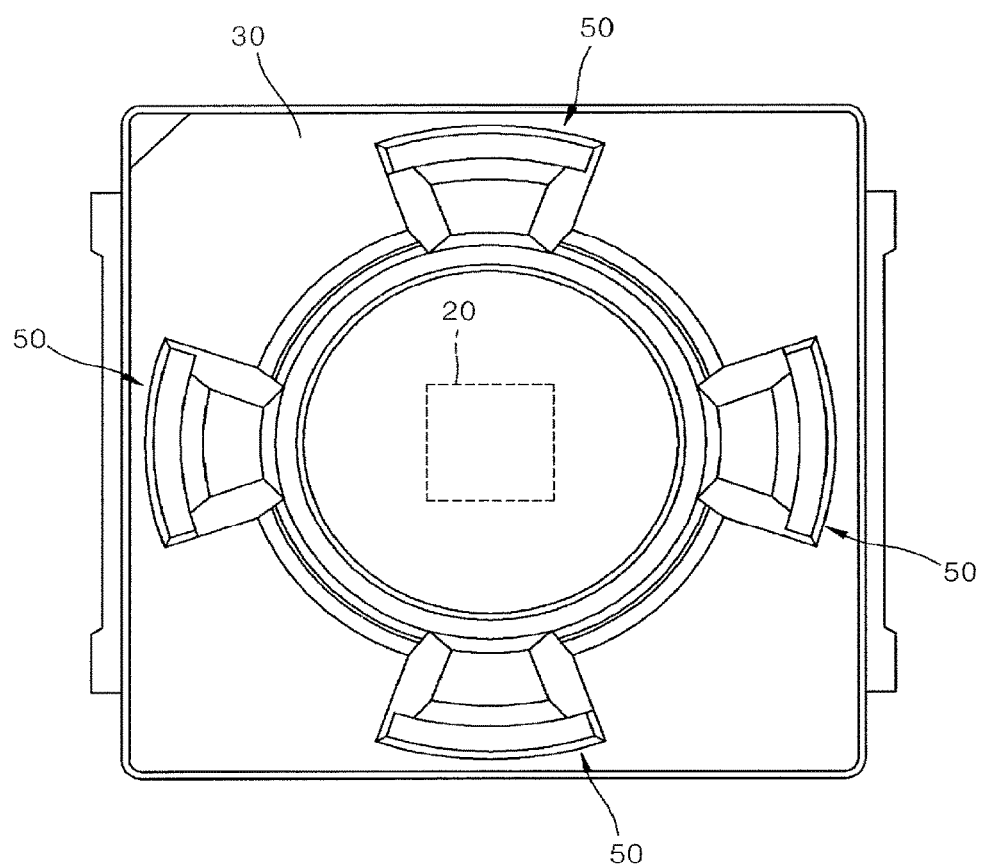
FIG. 10 is a plan view illustrating another example of the light emitting device package of FIG. 1.

Alternatively, at least two guide members 50 may be integrally molded with the encapsulation material 30 to protrude in the direction toward the lens 40. Also, as illustrated in FIG. 10, four guide members 50 may be integrally molded with the encapsulation material 30 to protrude in the direction toward the lens 40.

Also, as illustrated in FIG. 4, to minimize light interference, a shadow phenomenon, and a shadow overlapping phenomenon, an outer surface of the guide member 50 may be partially rounded to correspond to an arc shape of an inlet of the incident part 40*a* of the lens 40. The top surface 54 may have an outer width L1 of about 400 micrometers to about 700 micrometers and an inner width L2 of about 200 micrometers to about 450 micrometers. Also, the bottom surface 55 may have an outer width L3 of about 30 micrometers to about 1,200 micrometers and an inner width L4 of about 500 micrometers to about 700 micrometers. Also, a side surface 58 of the guide member 50 may have an inclined angle K4 that is not greater than 20° (greater than 0°).

Also, the guide member 50 may comprise at least one material selected from the group consisting of an epoxy molding compound (EMC), an EMC containing at least reflection material, white silicon containing a reflection material, a photo solder resister (PSR), and a combination thereof.

Also, the guide member 50 may be molded, dispensed, or screen-printed on the substrate 10.

More particularly, for example, the guide member 50 may be formed of an epoxy resin composition, a silicon resin composition, a modified epoxy resin composition such as a silicone modified epoxy resin composition, a modified silicon resin composition such as an epoxy modified silicon resin, a polyimide resin composition, a modified polyimide resin composition, or a resin such as polyphthalamide (PPA), a polycarbonate resin, poly(phenylene sulfide) (PPS), a liquid crystal polymer (LCP), an ABS resin, a phenol resin, an acrylic resin, and a PBT resin.

Also, titanium oxide, silicon dioxide, titanium dioxide, zirconium dioxide, potassium titanate, alumina, aluminum nitride, boron nitride, mullite, chrome, or a light reflective material such as a white-based or metal-based component may be contained in the resin.

The guide member 50 may be formed of the same material as the encapsulation material 30 or formed of a material different from the encapsulation material 30. The different material may represent materials that are not absolutely identical to each other.

As illustrated in FIG. 1, the light emitting device package 100 in accordance with an embodiment may further include the lens 40 of which a portion of an inner surface of the light incident part 40*a* (an inner engaging surface 42') contacts the guide member 50, and on which a fixed part 41 fixed to the substrate 10 is disposed.

Figure 6:
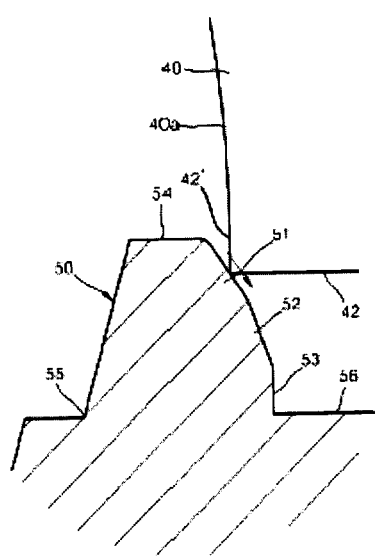
FIGS. 6 to 8 are cross-sectional views illustrating a process of aligning a light incident part of a lens by using the guide member of FIG. 1.
Figure 7:
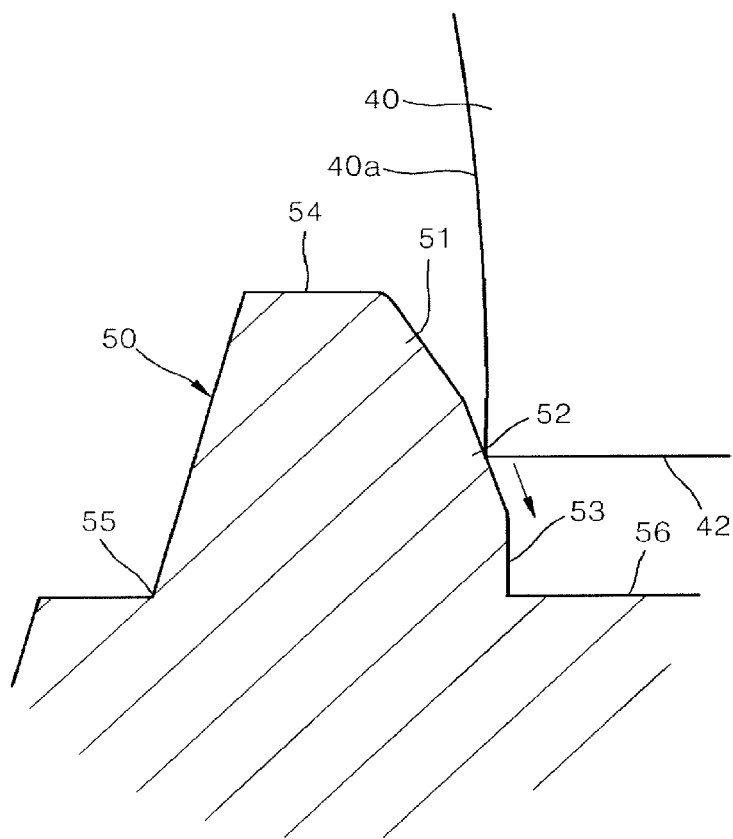
Figure 8:
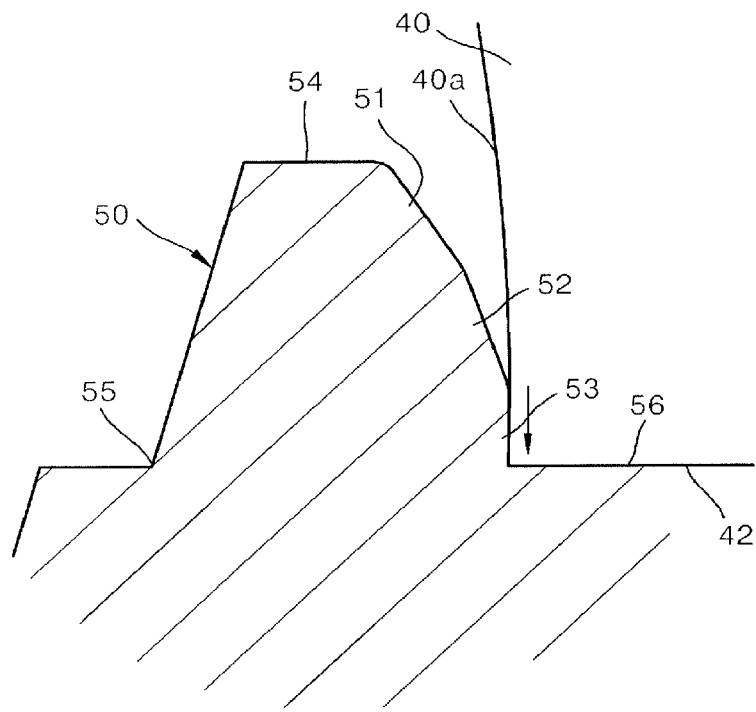

FIGS. 6 to 8 are cross-sectional views illustrating a process of aligning the light incident part 40*a* of the lens 40 by using the guide member 50 of FIG. 1.

Explaining the process of aligning the lens of the light emitting device package 100 in accordance with an embodiment in more detail in multi-stages, as illustrated in FIG. 6, the light incident part 40*a* of the lens 40 may be guided along the first inclined surface 51 of the guide member 50. Here, the light incident part 40*a* of the lens 40 may move along the top surface 54 and then be macroscopically guided first by the first inclined surface 51 of the guide member 50.

Then, as illustrated in FIG. 7, the light incident part 40*a* of the lens 40 may be guided along the second inclined surface 52 of the guide member 50. Here, while the light incident part 40*a* is finely guided by the second inclined surface 52, the light incident part 40*a* of the lens 40 may be finely aligned to balance forces of other light incident parts 40*a* that are disposed at a side opposite to the light incident part 40*a*.

For example, when the light incident part 40*a* disposed at one side of the lens 40 enters into the second inclined surface 52, the light incident parts 40*a* disposed at the other side of the lens 40 may also enter into the second inclined surface 52 to balance the forces therebetween.

That is, the first inclined surface 51 may align a macroscopic position of the lens 40, and the second inclined surface 52 may finely align the lens 40 to balance the lens 40.

Then, as illustrated in FIG. 8, the light incident part 40*a* of the lens 40 may finally contact the contact surface 53 and be guided along the contact surface 53. Then, when the bottom surface of the light incident part 40a reaches the stopper 56, the lens 40 may be aligned in a proper position.

Thus, the lens 40 may be easily aligned by using the guide member 50 and be improved in assembly accuracy to prevent luminance and color deviations of a display device, improve light characteristics, and produce high-quality products. Therefore, since the lens 40 is aligned in multi-stages by using the first inclined surface 51, the second inclined surface 52, the contact surface 53, and the stopper 56, the damage of the lens 40 may be prevented, and alignment accuracy of the lens 40 may be improved.

Figure 11:
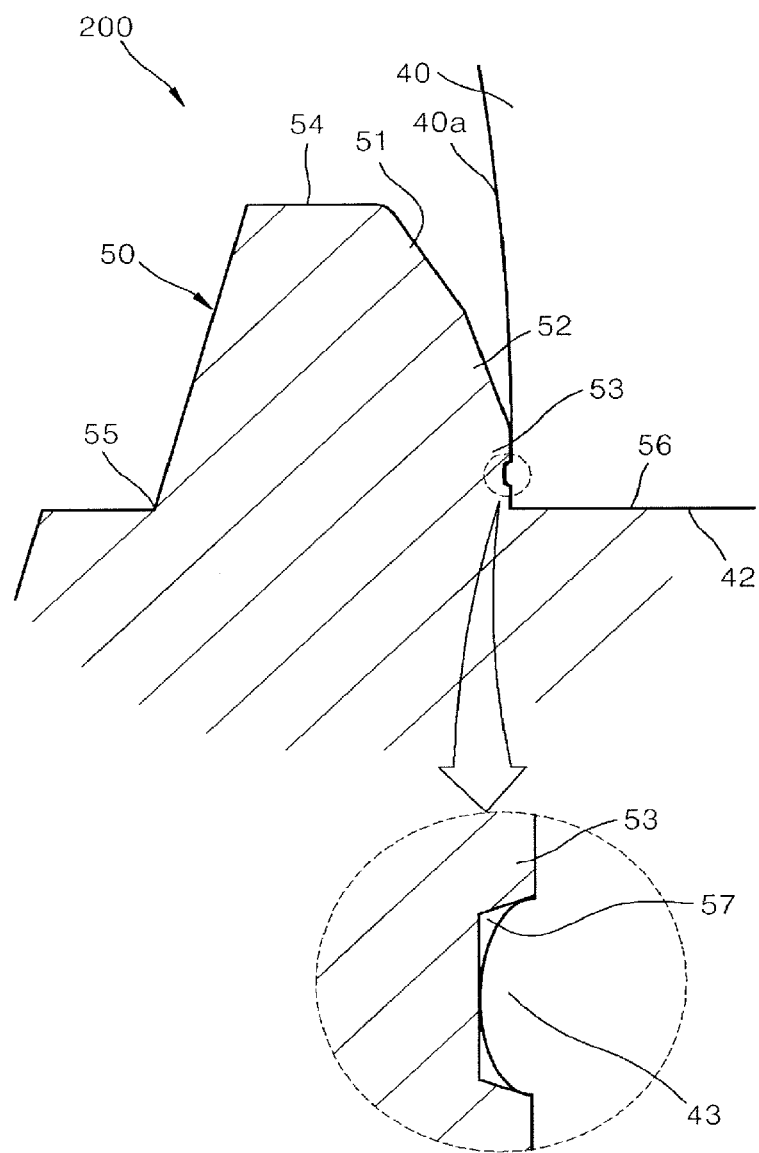
FIG. 11 is a cross-sectional view of a light emitting device package in accordance with another embodiment.

FIG. 11 is a cross-sectional view of a light emitting device package in accordance with another embodiment.

Referring to FIG. 11, a light emitting device package 200 in accordance with another embodiment may further include a hook surface 57 disposed on the contact surface 53 so that the hook surface 57 is engaged with a hook part 43 disposed on a light incident part 40a of a lens 40.

Thus, the light incident part 40a of the lens 40 is hooked on the hook surface 57 to more firmly couple the lens 40 to an encapsulation material 30. Also, it may easily confirm the state in which the lens 40 and the encapsulation material 30 are completely aligned with each other by using the "clack" feel or sound when the lens 40 and the encapsulation material 30 are assembled with each other.

Here, although the hook part 43 and the hook surface 57 are respectively disposed on the light incident part 40a of the lens 40 and the contact surface 53, the present disclosure is not limited thereto. For example, the hook part 43 and the hook surface 57 may be disposed on the contact surface 53 and the light incident part 40a of the lens 40, respectively.

Also, although not shown, a phosphor may be disposed around a light emitting device 20. For example, the phosphor may have following composition formula and color.

Oxide-based: yellow and green $Y_3Al_5O_{12}$:Ce, $Tb_3Al_5O_{12}$:Ce, and $Lu_3Al_5O_{12}$:Ce Silicate-based: yellow and green $(Ba,Sr)_2SiO_4$:Eu, and yellow and orange $(Ba,Sr)_3SiO_5$:Ce Nitride-based: green $\beta$-SiAlON:Eu, yellow $L_3Si_6O_{11}$:Ce, orange $\alpha$-SiAlON:Eu, and red $CaAlSiN_3$:Eu, $Sr_2Si_5N_8$:Eu, and $SrSiAl_4N_7$:Eu The composition of the phosphor may basically accord with stoichiometry. Also, each of elements may be substituted for the other element within each of the groups in the periodic table. For example, Sr may be substituted for Ba, Ca, Mg, and the like in the alkali (II) group, and lanthanum-based Tb, Lu, Sc, Gd, and the like. Also, Eu that is an active agent may be substituted for Ce, Tb, Pr, Er, Yb, and the like according to a desired energy level. Here, the active agent may be applied alone, or an additional active agent for modifying properties thereof may be additionally applied.

Also, a material such as quantum dot (QD) may be applied as a material substituted for the phosphor. Alternatively, the phosphor and QD may be mixed with the LED, or each of the phosphor and the QD may be used alone.

The QD may be constituted by a core formed of CdSe, InP, and the like, a shell (about 0.5 nm to about 2 nm) formed of ZnS, ZnSe, and the like, and a regand for stabilizing the shell. The QD may realize various colors according to a size thereof.

Also, the phosphor or quantum dot may be applied to the LED chip or light emitting device by being sprayed, covered in a film shape, or attached in a sheet shape such as a film or ceramic phosphor.

The spraying method may generally include dispensing and spray coating methods. Here, the dispensing method may include a pneumatic method and a screw or linear type mechanical method. In addition, a small amount of phosphor or quantum dot may be discharged by using a jetting method to control a dotted amount, and also, a color coordinate may be controlled through the dotted amount control. The method of spraying the phosphor in a lump on a wafer level or light emitting device substrate may be easy in productivity and thickness control.

The method of directly covering the film on the light emitting device or LED chip may include an electrophoresis, screen printing, or a phosphor molding method. That is, the above-described methods may vary according to whether a side surface of the LED chip is coated.

To control efficiency of the light emitting phosphor having a long wavelength, which re-absorbs light having a short wavelength, of at least two kinds of phosphors having light emitting wavelengths different from each other, the at least two kinds of phosphors having the light emitting wavelengths different from each other may be distinguished from each other. To minimize the re-absorption and interference of the LED chip and the at least two kinds of phosphors, a DBR (ODR) layer may be disposed between each of the layers.

Also, to form a uniform coating layer, the phosphor may be formed in a film or ceramic shape and then be attached to the LED chip or light emitting device.

A light conversion material may be located at a remote position to cause a difference in light efficiency and light distribution characteristics. Here, the light conversion material may be located together with light transmission polymer or glass according to durability and heat-resistance thereof.

As described above, since the phosphor coating technology plays a large role in determining the light characteristics of the light emitting device, technologies for controlling a thickness of the phosphor coating layer and the uniform dispersion of the phosphor are being variously studied. Like the phosphor, the QD may also be located at the LED chip or light emitting device. Also, the QD may be disposed between the glass or light transmission polymer materials to convert light.

Figure 12:
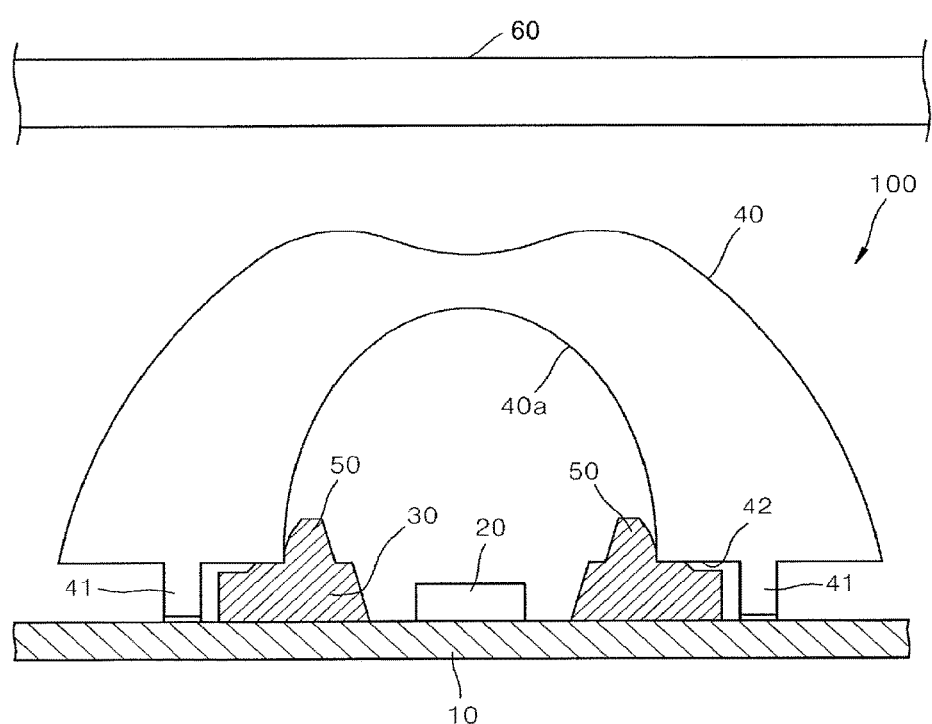
FIG. 12 is a cross-sectional view of a backlight unit in accordance with an embodiment.

FIG. 12 is a cross-sectional view of a backlight unit in accordance with embodiments.

Referring to FIG. 12, a backlight unit in accordance with an embodiment may largely include a substrate 10, a light emitting device 20, an encapsulation material 30, a guide member 50, and a light guide plate 60.

Here, the backlight unit may be disposed on an LCD panel to transmit light toward the LCD panel. The light emitting device 20, the encapsulation material 30, and the guide member 50 may have the same constitution and effect as those described with reference to FIGS. 1 to 5.

The light guide plate 60 may be disposed in a path of light emitted from the light emitting device 20 to transmit the light emitted from the light emitting device 20 into a wider area. The light guide plate 60 may be formed of a polycarbonate-based resin, a polysulfone-based resin, a polyacrylate-based resin, a polystyrene-based resin, a polyvinyl chloride-based resin, a polyvinyl alcohol-based resin, a polynorbornene-based resin, or a polyester-based resin. In addition, the light guide plate 60 may be formed of various light transmission resin materials. Also, a fine pattern, a fine protrusion, or a diffusion layer may be formed on a surface of the light guide plate 60, or microbubbles may be formed in the light guide plate 60.

The backlight unit in accordance with an embodiment may be a direct-type backlight unit in which the light emitting device 20 is disposed under the light guide plate 60.

Figure 13:
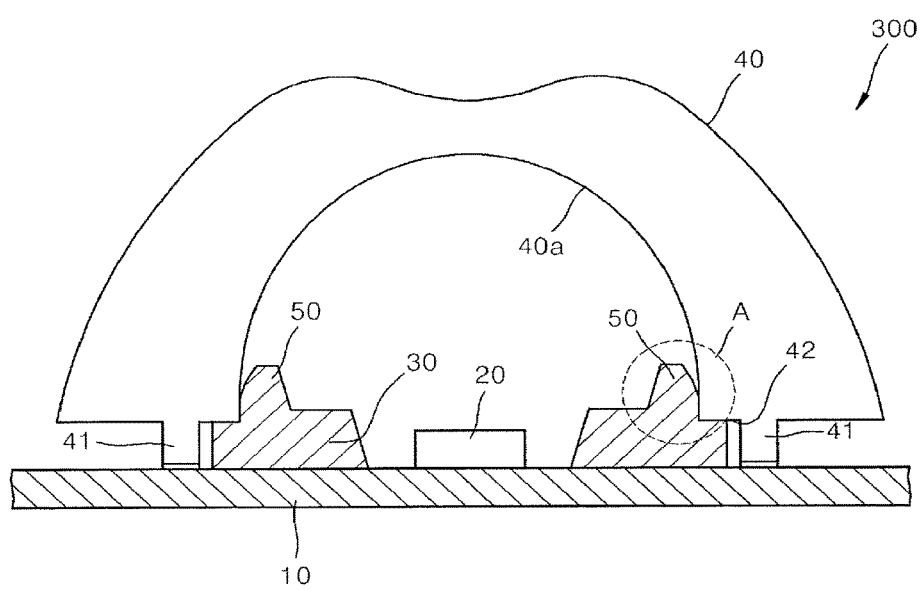
FIG. 13 is a cross-sectional view of a light emitting device package in accordance with an embodiment or another embodiment.
Figure 14:
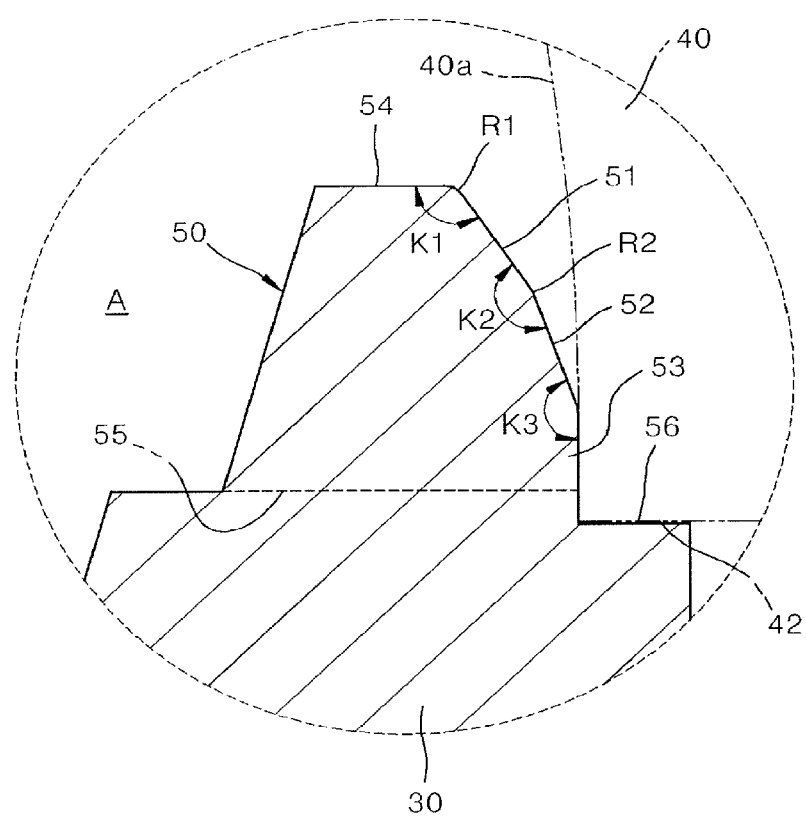
FIG. 14 is an enlarged view of a portion A of FIG. 13.
Figure 15:
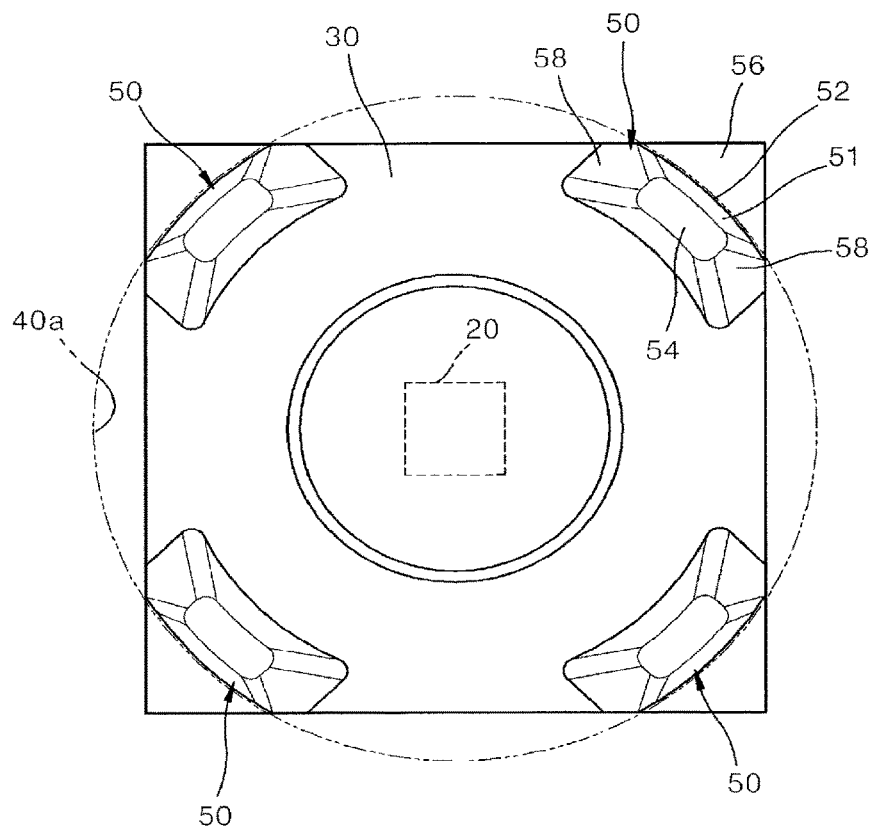
FIG. 15 is a plan view illustrating an example of the light emitting device package of FIG. 13.
Figure 16:
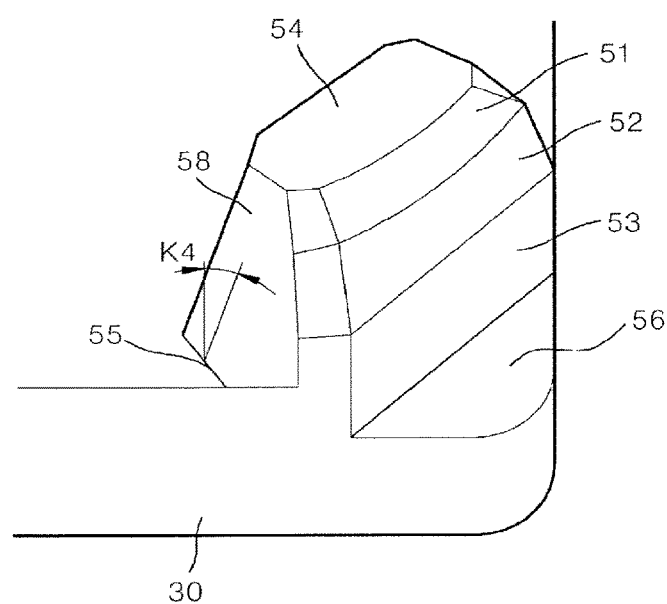
FIG. 16 is a perspective view illustrating an example of a guide member of FIG. 13.

FIG. 13 is a cross-sectional view of a light emitting device package in accordance with an embodiment or another embodiment, FIG. 14 is an enlarged view of a portion A of FIG. 13, FIG. 15 is a plan view illustrating an example of the light emitting device package of FIG. 13, and FIG. 16 is a perspective view illustrating an example of a guide member of FIG. 13.

Referring to FIGS. 13 to 16, a light emitting device package 300 in accordance with an embodiment or another embodiment may largely include a substrate 10, a light emitting device 20, an encapsulation material 30, and a guide member 50.

Here, the substrate 10 and the light emitting device 20 may have the same constitution and effect as those of the light emitting device package 100 in accordance with the embodiment that is described with reference to FIGS. 1 to 12. Thus, detailed descriptions thereof will be omitted.

Also, the encapsulation material 30 may be disposed on the substrate 10 and have a through-hole to surround the light emitting device 20. As illustrated in FIG. 15, the through-hole of the encapsulation material 30 may have, for example, a circular shape. In addition, the through-hole may have various shapes such as a quadrangular shape, an oval shape, a polygonal shape, a trapezoid shape, and a combined shape.

Also, the encapsulation material 30 may be formed of at least one material selected from an epoxy molding compound (EMC), an EMC containing at least reflection material, white silicon containing a reflection material, a photo solder resister (PSR), and a combination thereof.

Also, the encapsulation material 30 may be molded, dispensed, or screen-printed on the substrate 10 in a quadrangular plate shape as illustrated in FIG. 15.

More particularly, for example, the encapsulation material 30 may be formed of an epoxy resin composition, a silicon resin composition, a modified epoxy resin composition such as a silicone modified epoxy resin composition, a modified silicon resin composition such as an epoxy modified silicon resin, a polyimide resin composition, a modified polyimide resin composition, or a resin such as polyphthalamide (PPA), a polycarbonate resin, poly(phenylene sulfide) (PPS), a liquid crystal polymer (LCP), an ABS resin, a phenol resin, an acrylic resin, and a PBT resin.

Also, titanium oxide, silicon dioxide, titanium dioxide, zirconium dioxide, potassium titanate, alumina, aluminum nitride, boron nitride, mullite, chrome, or a reflective material such as a white-based or metal-based component may be contained in the resin.

Figure 20:
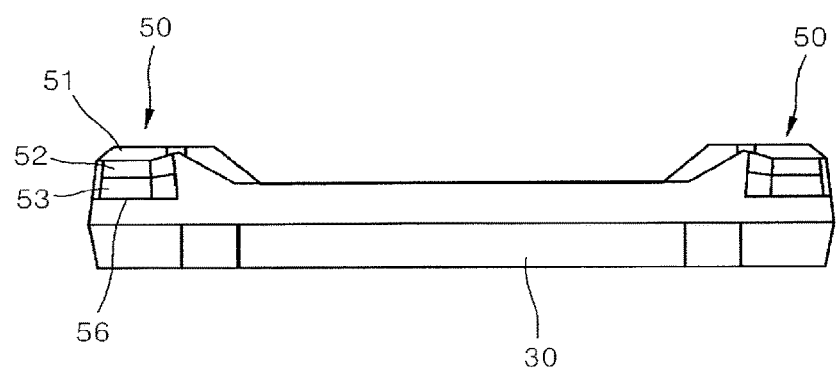
FIG. 20 is a cross-sectional view illustrating another example of the light emitting device package of FIG. 13.

As illustrated in FIG. 20, the encapsulation material 30 may have various shapes. Thus, the shape of the encapsulation material 30 of the light emitting device package 300 in accordance with an embodiment or another embodiment is not limited to that illustrated in FIG. 13.

The guide member 50 may be disposed on each of four edges of the encapsulation member 30 to guide an assembly path of a lens 40. As illustrated in FIG. 14, the guide member 50 may include a first inclined surface 51, a second inclined surface 52, a contact surface 53, a top surface 54, a bottom surface 55, and a stopper 56.

Here, as illustrated in FIG. 14, the first inclined surface 51 may be a portion having a relatively gentle inclination to primarily block a light incident part 40a of the lens 40.

Also, the second inclined surface 52 may be continuously disposed on the first inclined surface 51 to secondarily guide the light incident part 40a of the lens 40 and have a second inclination relatively greater than that of the first inclination.

Also, the contact surface 53 may be continuously disposed on the second inclined surface 52 to finally contact and be fixed to the light incident part 40a of the lens 40. Thus, the contact surface 53 may have a contact portion. Here, the contact surface 53 may have an inclined angle of about 90° with respect to an assembly direction toward the lens 40.

The top surface 54 may be a flat portion at which the first inclined surface 51 starts, and the bottom surface 55 may be a portion at which the contact surface 53 is ended.

Here, the bottom surface 55 may have an area greater than that of the top surface 54. As illustrated in FIGS. 13 to 16, for example, the guide member 50 of the light emitting device package 300 in accordance with an embodiment or another embodiment may generally have a wide lower portion and a narrow upper portion.

Also, as illustrated in FIG. 14, the first inclined surface 51 may have an inclined internal angle K1 of about 100° to about 135° with respect to the top surface 54, the second inclined surface 52 may have an inclined internal angle K2 of about 150° to about 175° with respect to the first inclined surface 51, and the contact surface 53 may have an inclined internal angle K3 greater than at least the inclined internal angle K2 with respect to the second inclined surface 52 so that the guide member 50 guides the light incident part 40a of the lens 40 in a primarily gentile inclined direction and then in a secondarily significantly inclined direction when the light incident part 40a of the lens 40 is guided.

Also, as illustrated in FIG. 14, an edge R1 between the top surface 54 and the first inclined surface 51 and an edge R2 between the first inclined surface 51 and the second inclined surface 52 may be roundly chamfered to prevent the component from being damaged when the light incident part 40a of the lens 40 collides with the components.

Also, as illustrated in FIG. 14, the stopper 56 may be connected to the contact surface 53 and be in contact with a bottom surface 42 of the light incident part 40a of the lens 40. Thus, the stopper 56 may determine an assembly position of the light incident part 40a of the lens 40. Selectively, a top surface of the stopper 56 may be disposed lower than the bottom surface 55 to seat the lens 40 thereon.

Also, as illustrated in FIG. 15, the encapsulation material 30 may have a substantially quadrangular plate shape. The guide member 50 may be integrally molded with the encapsulation material 30 so that four guide members 50 protrude from four corners of the encapsulation material 50 toward the lens 40.

The guide member 50 may be integrally molded with the encapsulation material 30 so that at least fourteen guide members 50 protrude in the direction toward the lens 40.

Also, as illustrated in FIG. 16, a side surface 58 of the guide member 50 may have an inclined angle K4 of about 45° or less.

Also, the guide member 50 may be formed of at least one material selected from an epoxy molding compound (EMC), an EMC containing at least reflection material, white silicon containing a reflection material, a photo solder resister (PSR), and a combination thereof.

Also, the guide member 50 may be molded, dispensed, or screen-printed on the substrate 10.

More particularly, for example, the guide member 50 may be formed of an epoxy resin composition, a silicon resin composition, a modified epoxy resin composition such as a silicone modified epoxy resin composition, a modified silicon resin composition such as an epoxy modified silicon resin, a polyimide resin composition, a modified polyimide resin composition, or a resin such as polyphthalamide (PPA), a polycarbonate resin, poly(phenylene sulfide) (PPS), a liquid crystal polymer (LCP), an ABS resin, a phenol resin, an acrylic resin, and a PBT resin.

Also, titanium oxide, silicon dioxide, titanium dioxide, zirconium dioxide, potassium titanate, alumina, aluminum nitride, boron nitride, mullite, chrome, or a reflective material such as a white-based or metal-based component may be contained in the resin.

The guide member 50 may be formed of the same material as the encapsulation material 30 or formed of a material different from the encapsulation material 30. The different material may represent materials that are not absolutely identical to each other.

Although not shown, the guide member 50 may not protrude in the direction toward the lens 40, and the first inclined surface 51, the second inclined surface 52, and the contact surface 53 of the guide member 50 may be disposed on a side surface of an edge of the encapsulation material 30. Also, the stopper 56 may be omitted.

As illustrated in FIG. 13, the light emitting device package 300 in accordance with an embodiment may further include the lens 40 of which a portion of an inner surface of the light incident part 40a contacts the guide member 50, and on which a fixed part 41 fixed to the substrate 10 is disposed.

Figure 17:
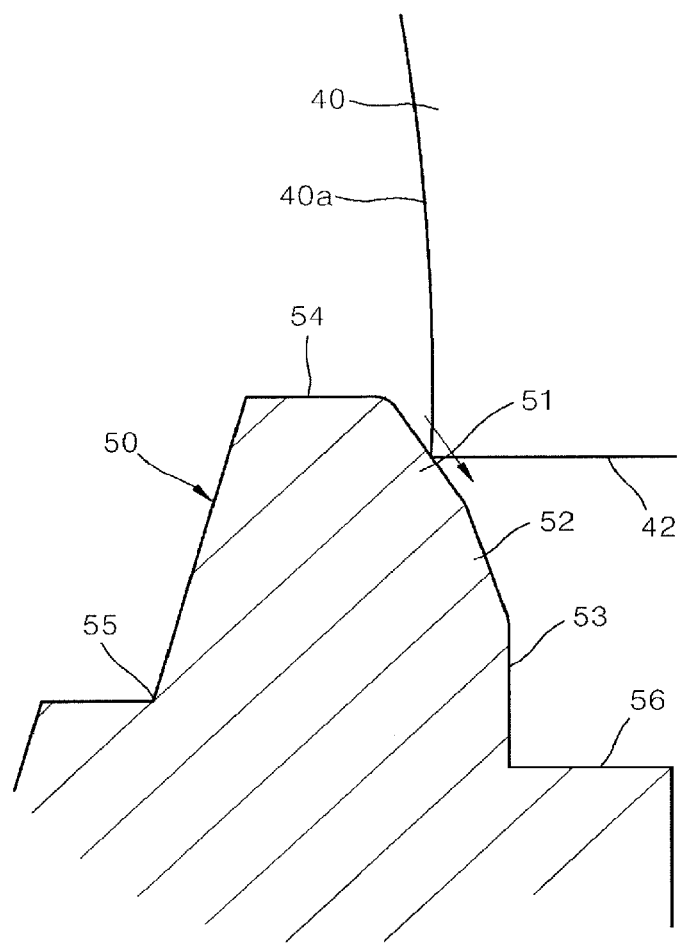
FIGS. 17 to 19 are cross-sectional views illustrating a process of aligning a light incident part of a lens by using the guide member of FIG. 13.
Figure 18:
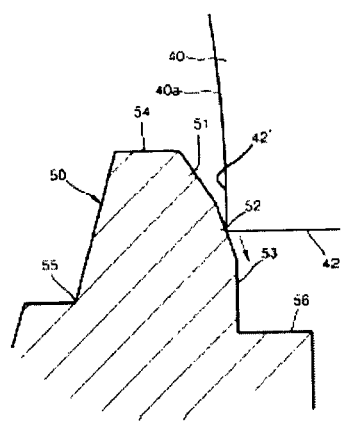
Figure 19:
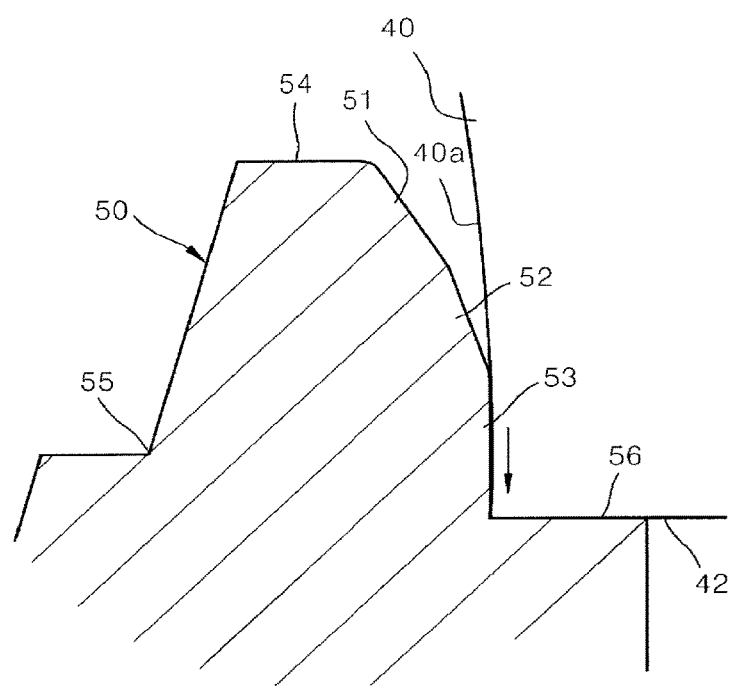

FIGS. 17 to 19 are cross-sectional views illustrating a process of aligning a light incident part 40a of a lens 40 by using the guide member 50 of FIG. 13.

Explaining the process of aligning the lens of the light emitting device package 300 in accordance with an embodiment or another embodiment in more detail in stages, as illustrated in FIG. 17, the light incident part 40a of the lens 40 may be guided along the first inclined surface 51 of the guide member 50. Here, the light incident part 40a of the lens 40 may move along the top surface 54 and then be macroscopically guided first by the first inclined surface 51 of the guide member 50.

Then, as illustrated in FIG. 18, the light incident part 40a of the lens 40 may be guided along the second inclined surface 52 of the guide member 50. Here, while the light incident part 40a is finely guided by the second inclined surface 52, the light incident part 40a of the lens 40 may be finely aligned to balance forces of other light incident parts 40a that are disposed at a side opposite to the light incident part 40a.

For example, when the light incident part 40a disposed at one side of the lens 40 enters into the second inclined surface 52, the light incident parts 40a disposed at the other side of the lens 40 may also enter into the second inclined surface 52 to balance the forces therebetween.

That is, the first inclined surface 51 may align a macroscopic position of the lens 40, and the second inclined surface 52 may finely align the lens 40 to balance the lens 40.

Then, as illustrated in FIG. 19, the light incident part 40a of the lens 40 may finally contact the contact surface 53 and be guided along the contact surface 53. Then, when the bottom surface of the light incident part 40a reaches the stopper 56, the lens 40 may be aligned in a proper position.

Thus, the lens 40 may be easily aligned by using the guide member 50 and be improved in assembly accuracy to prevent luminance and color deviations of a display device, improve light characteristics, and produce high-quality products. Therefore, since the lens 40 is aligned in multi-stages by using the first inclined surface 51, the second inclined surface 52, the contact surface 53, and the stopper 56, the damage of the lens 40 may be prevented, and alignment accuracy of the lens 40 may be improved.

Figure 21:
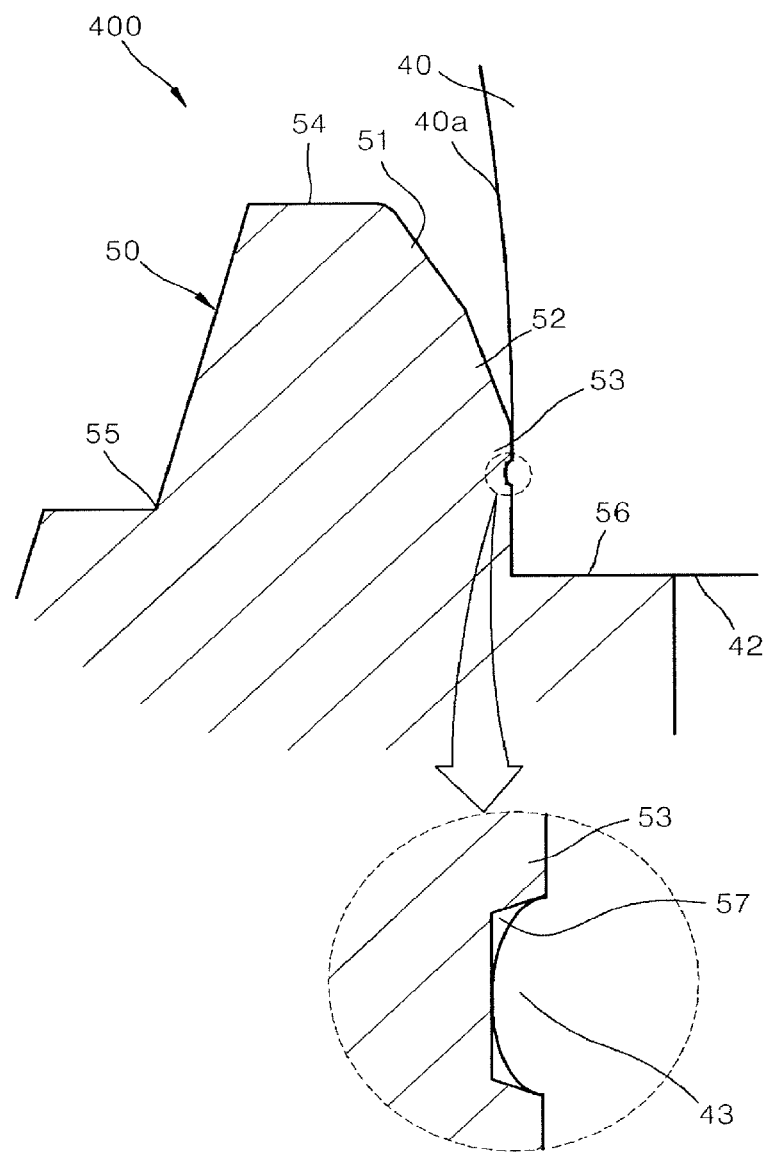
FIG. 21 is a cross-sectional view of a light emitting device package in accordance with an embodiment or another embodiment.

FIG. 21 is a cross-sectional view of a light emitting device package 400 in accordance with an embodiment or another embodiment.

Referring to FIG. 21, a light emitting device package 400 in accordance with another embodiment may further include a hook surface 57 disposed on the contact surface 53 so that the hook surface 57 is engaged with a hook part 43 disposed on a light incident part 40a of a lens 40.

Thus, the light incident part 40a of the lens 40 is hooked on the hook surface 57 to more firmly couple the lens 40 to an encapsulation material 30. Also, it may easily confirm the state in which the lens 40 and the encapsulation material 30 are completely aligned with each other by using the "clack" feel or sound when the lens 40 and the encapsulation material 30 are assembled with each other.

Here, although the hook part 43 and the hook surface 57 are respectively disposed on the light incident part 40a of the lens 40 and the contact surface 53, the present disclosure is not limited thereto. For example, the hook part 43 and the hook surface 57 may be disposed on the contact surface 53 and the light incident part 40a of the lens 40, respectively.

Figure 22:
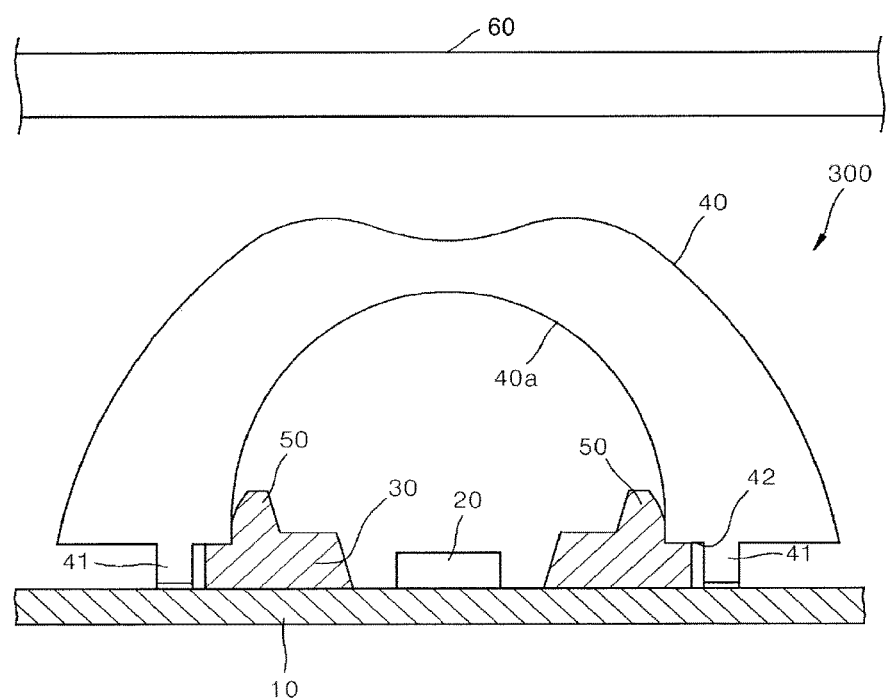
FIG. 22 is a cross-sectional view of a backlight unit in accordance with another embodiment.

Also, although not shown, a phosphor may be disposed around a light emitting device 20. FIG. 22 is a cross-sectional view of a backlight unit in accordance with another embodiment.

Referring to FIG. 22, a backlight unit in accordance with another embodiment may largely include a substrate 10, a light emitting device 20, an encapsulation material 30, a guide member 50, and a light guide plate 60.

Here, the backlight unit may be disposed on an LCD panel to transmit light toward the LCD panel. The light emitting device 20, the encapsulation material 30, and the guide member 50 may have the same constitution and effect as those described with reference to FIGS. 13 to 17.

The light guide plate 60 may be disposed in a path of light emitted from the light emitting device 20 to transmit the light emitted from the light emitting device 20 into a wider area. The light guide plate 60 may be formed of a polycarbonate-based resin, a polysulfone-based resin, a polyacrylate-based resin, a polystyrene-based resin, a polyvinyl chloride-based resin, a polyvinyl alcohol-based resin, a polynorbornene-based resin, or a polyester-based resin. In addition, the light guide plate 60 may be formed of various light transmission resin materials. Also, a fine pattern, a fine protrusion, or a diffusion layer may be formed on a surface of the light guide plate 60, or microbubbles may be formed in the light guide plate 60.

The backlight unit in accordance with another embodiment may be a direct-type backlight unit in which the light emitting device 20 is disposed under the light guide plate 60.

Figure 23:
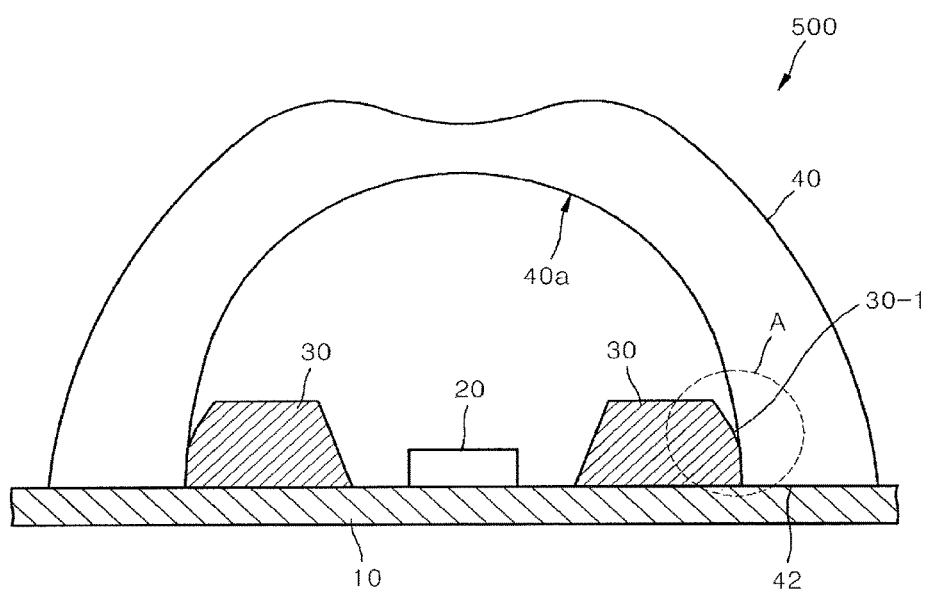
FIG. 23 is a cross-sectional view of a light emitting device package in accordance with an embodiment or another embodiment.
Figure 24:
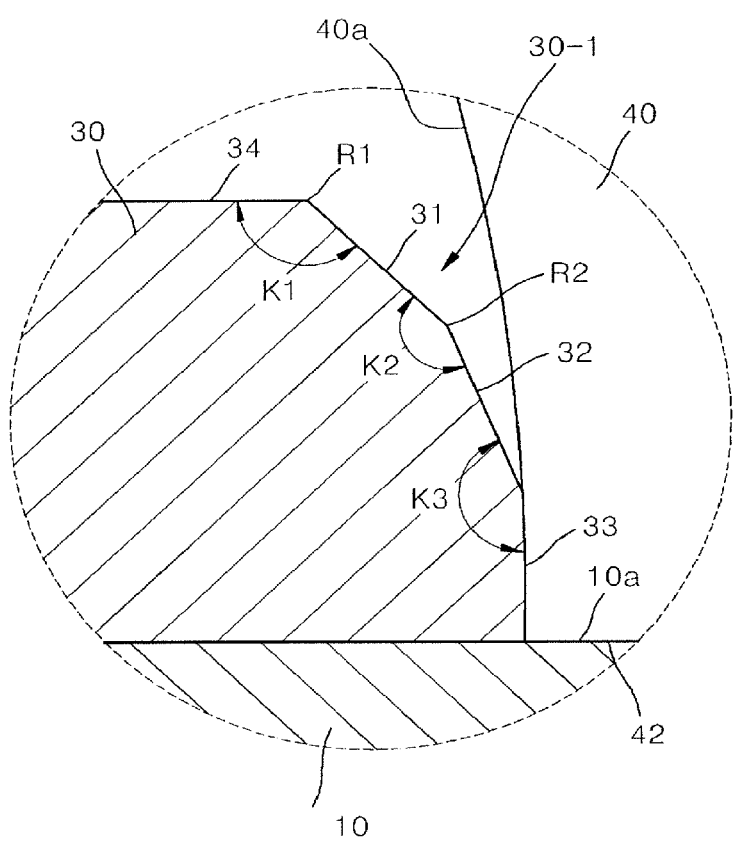
FIG. 24 is an enlarged view of a portion A of FIG. 23.
Figure 25:
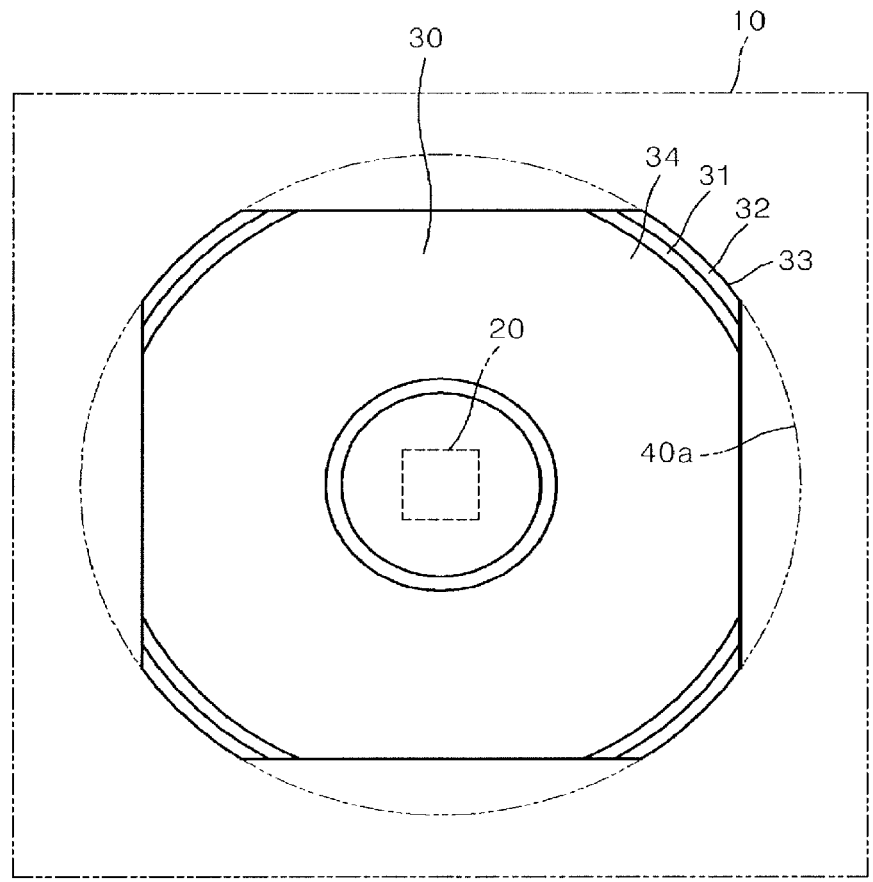
FIG. 25 is a plan view illustrating an example of the light emitting device package of FIG. 23.
Figure 26:
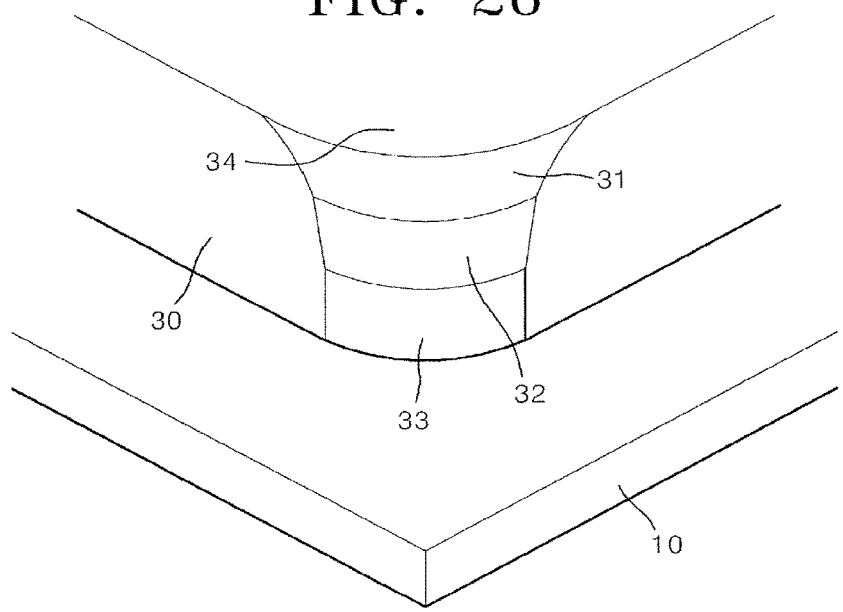
FIG. 26 is a perspective view illustrating an example of a guide member of FIG. 23.

FIG. 23 is a cross-sectional view of a light emitting device package 500 in accordance with an embodiment or another embodiment, FIG. 24 is an enlarged view of a portion A of FIG. 23, FIG. 25 is a plan view illustrating an example of the light emitting device package 500 of FIG. 23, and FIG. 26 is a perspective view illustrating an example of a guide member 30-1 of FIG. 23.

Referring to FIGS. 23 to 26, a light emitting device package 500 in accordance with an embodiment or another embodiment may largely include a substrate 10, a light emitting device 20, an encapsulation material 30, and a guide member 30-1.

Here, the substrate 10 and the light emitting device 20 may have the same constitution and effect as those of the light emitting device package 100 in accordance with the embodiment that is described with reference to FIGS. 1 to 12. Thus, detailed descriptions thereof will be omitted.

Also, the encapsulation material 30 may be disposed on the substrate 10 and have a through-hole to surround the light emitting device 20. As illustrated in FIG. 25, the through-hole of the encapsulation material 30 may have, for example, a circular shape. In addition, the through-hole may have various shapes such as a quadrangular shape, an oval shape, a polygonal shape, a trapezoid shape, and a combined shape.

Also, the encapsulation material 30 may be formed of at least one material selected from an epoxy molding compound (EMC), an EMC containing at least reflection material, white silicon containing a reflection material, a photo solder resister (PSR), and a combination thereof.

Also, the encapsulation material 30 may be molded, dispensed, or screen-printed on the substrate 10 in a quadrangular plate shape with rounded corners as illustrated in FIG. 25.

More particularly, for example, the encapsulation material 30 may be formed of an epoxy resin composition, a silicon resin composition, a modified epoxy resin composition such as a silicone modified epoxy resin composition, a modified silicon resin composition such as an epoxy modified silicon resin, a polyimide resin composition, a modified polyimide resin composition, or a resin such as polyphthalamide (PPA), a polycarbonate resin, poly(phenylene sulfide) (PPS), a liquid crystal polymer (LCP), an ABS resin, a phenol resin, an acrylic resin, and a PBT resin.

Also, titanium oxide, silicon dioxide, titanium dioxide, zirconium dioxide, potassium titanate, alumina, aluminum nitride, boron nitride, mullite, chrome, or a reflective material such as a white-based or metal-based component may be contained in the resin.

Also, the encapsulation material 30 may have various shapes. Thus, the shape of the encapsulation material 30 of the light emitting device package 500 in accordance with an embodiment or another embodiment is not limited to that illustrated in FIG. 23.

For example, the guide member 30-1 may be disposed on each of four side edges of the encapsulation member 30. As illustrated in FIG. 23, the guide member 30-1 may be a side surface of the encapsulation material that is completely inserted into a light incident part 40a of a lens 40 and guides an assembly path of the lens 40. More particularly, as illustrated in FIG. 24, the guide member 30-1 may have a first inclined surface 31, a second inclined surface 32, a contact surface 33, and a top surface 34.

Here, as illustrated in FIG. 24, the first inclined surface 31 may be a portion having a relatively gentile inclination to primarily block a light incident part 40a of the lens 40.

Also, the second inclined surface 32 may be continuously disposed on the first inclined surface 31 to secondarily guide the light incident part 40a of the lens 40 and have a second inclination relatively greater than that of the first inclination.

Also, the contact surface 33 may be continuously disposed on the second inclined surface 52 to finally contact and be fixed to the light incident part 40a of the lens 40. Thus, the contact surface 33 may have a contact portion. Here, the contact surface 33 may have an inclined angle of about 90° with respect to an assembly direction toward the lens 40.

The top surface 34 may be a flat portion at which the first inclined surface 31 starts.

Also, as illustrated in FIG. 24, the first inclined surface 31 may have an inclined internal angle K1 of about 100° to about 135° with respect to the top surface 34, the second inclined surface 32 may have an inclined internal angle K2 of about 150° to about 175° with respect to the first inclined surface 31, and the contact surface 33 may have an inclined internal angle K3 greater than at least the inclined internal angle K2 with respect to the second inclined surface 32 so that the guide member 30-1 guides the light incident part 40a of the lens 40 in a primarily gentile inclined direction and then in a secondarily significantly inclined direction when the light incident part 40a of the lens 40 is guided.

For example, as illustrated in FIG. 24, a edge R1 between the top surface 34 and the first inclined surface 31 and a edge R2 between the first inclined surface 31 and the second inclined surface 32 may be roundly chamfered to prevent the component from being damaged when the light incident part 40a of the lens 40 collides with the components.

Also, as illustrated in FIG. 24, the substrate 10 may contact the contact surface 33 and also contact a bottom surface 42 of the light incident part 40a of the lens 40. Thus, the substrate 10 may determine an assembly position of the light incident part 40a of the lens 40. Selectively, a top surface 10a of the substrate 10 may be disposed lower or higher than the bottom surface 42 to seat the lens 40 thereon.

Also, as illustrated in FIG. 25, the encapsulation material 30 may have a substantially quadrangular plate shape with rounded corners. The guide member 30-1 may be integrally molded with the encapsulation material 30 so that the guide member 30-1 is completely inserted into the light incident part 40a of the lens 40 at four side edges of the encapsulation material 30.

Also, the guide member 30-1 may be formed of at least one material selected from an epoxy molding compound (EMC), an EMC containing at least reflection material, white silicon containing a reflection material, a photo solder resister (PSR), and a combination thereof.

More particularly, for example, the guide member 30-1 may be formed of an epoxy resin composition, a silicon resin composition, a modified epoxy resin composition such as a silicone modified epoxy resin composition, a modified silicon resin composition such as an epoxy modified silicon resin, a polyimide resin composition, a modified polyimide resin composition, or a resin such as polyphthalamide (PPA), a polycarbonate resin, poly(phenylene sulfide) (PPS), a liquid crystal polymer (LCP), an ABS resin, a phenol resin, an acrylic resin, and a PBT resin.

Also, titanium oxide, silicon dioxide, titanium dioxide, zirconium dioxide, potassium titanate, alumina, aluminum nitride, boron nitride, mullite, chrome, or a reflective material such as a white-based or metal-based component may be contained in the resin.

The guide member 30-1 may be formed of the same material as the encapsulation material 30 or formed of a material different from the encapsulation material 30. The different material may represent materials that are not absolutely identical to each other.

As illustrated in FIG. 23, the light emitting device package 500 in accordance with an embodiment or another embodiment may further include the lens 40 of which a portion of an inner surface of the light incident part 40a contacts the guide member 30-1 and which is disposed on the substrate 10.

Figure 27:
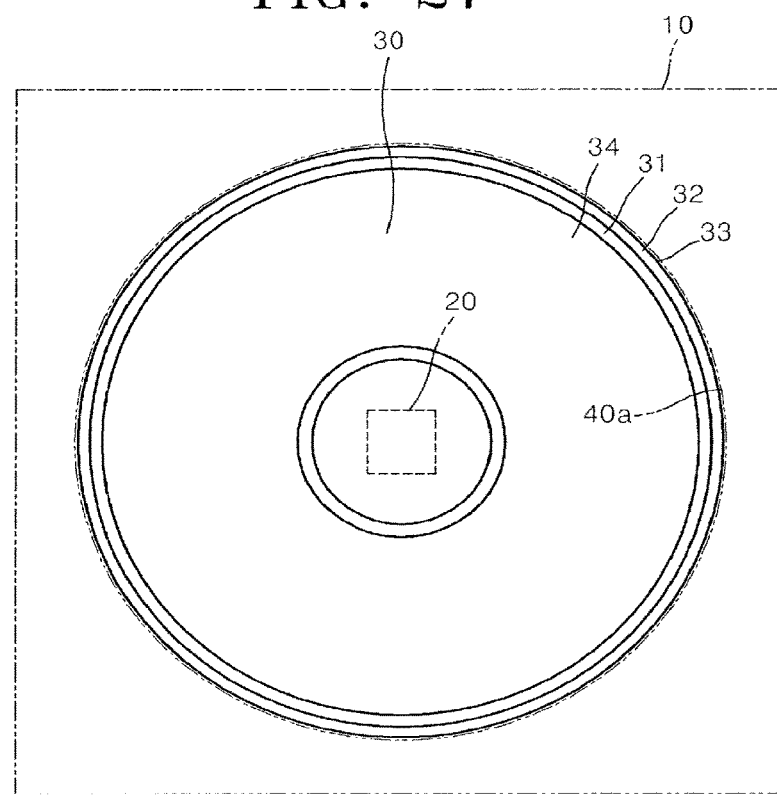
FIG. 27 is a plan view illustrating another example of an encapsulation material of FIG. 23.

FIG. 27 is a plan view illustrating another example of an encapsulation material 30 of FIG. 23.

Referring to FIG. 27, the encapsulation material 30 may have a circular shape on the whole. Also, the encapsulation material 30 may be molded and completely inserted into the light incident part 40a of the lens 40. In this case, the guide member 30-1 may be an outer circumferential surface that circularly surrounds the encapsulation material 30-1.

Figure 28:
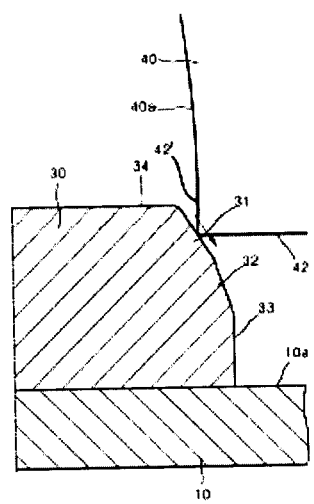
FIGS. 28 to 30 are cross-sectional views illustrating a process of aligning a light incident part of a lens by using the guide member of FIG. 23.
Figure 29:
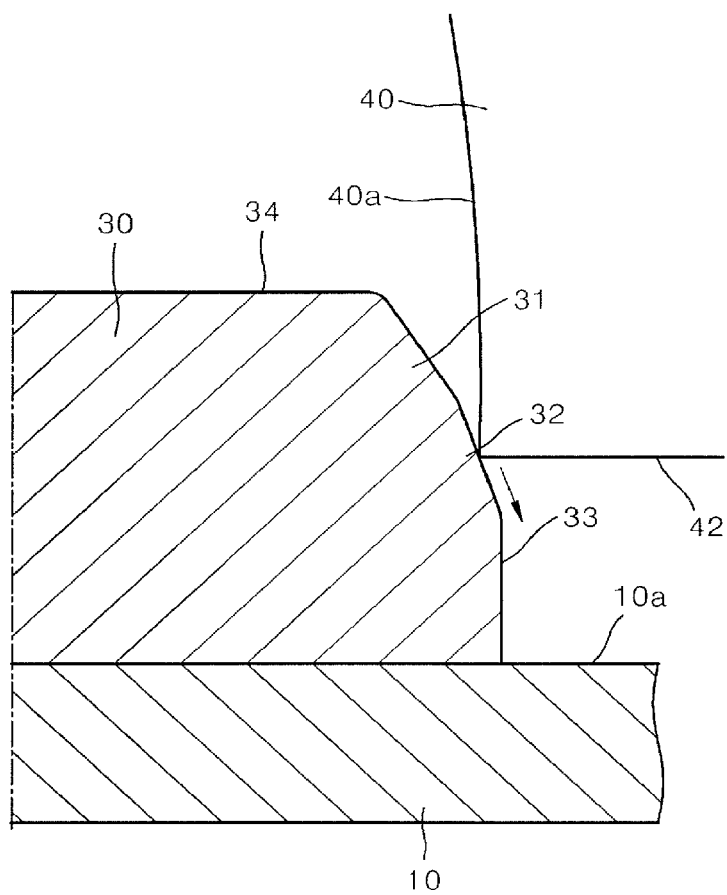
Figure 30:
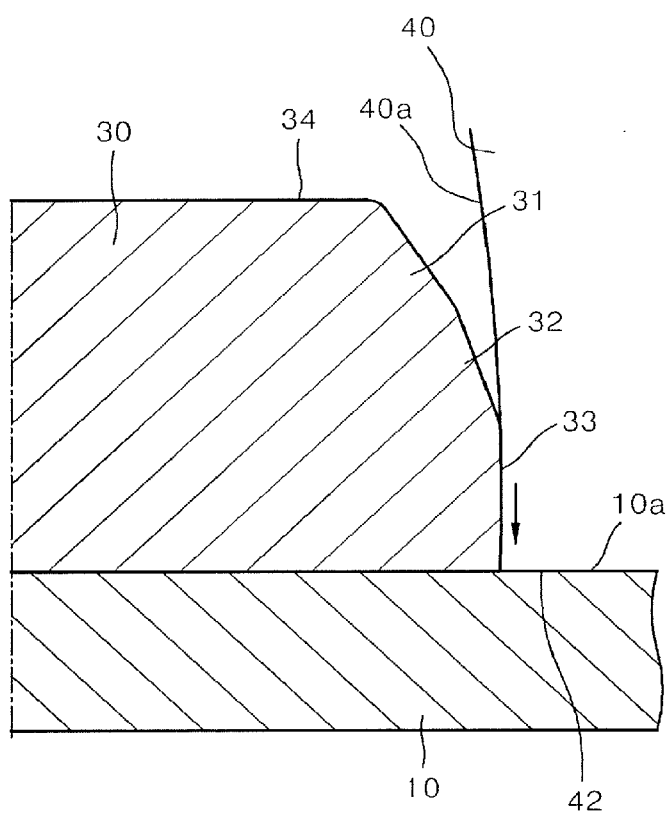

FIGS. 28 to 30 are cross-sectional views illustrating a process of aligning the light incident part 40a of the lens 40 by using the guide member 30-1 of FIG. 23.

Explaining the process of aligning the lens of the light emitting device package 500 in accordance with an embodiment or another embodiment in more detail in stages, as illustrated in FIG. 28, the light incident part 40a of the lens 40 may be guided along the first inclined surface 31 of the guide member 30-1. Here, the light incident part 40a of the lens 40 may move along the top surface 34 and then be macroscopically guided first by the first inclined surface 31 of the guide member 30-1.

Then, as illustrated in FIG. 29, the light incident part 40a of the lens 40 may be guided along the second inclined surface 32 of the guide member 30-1. Here, while the light incident part 40a is finely guided by the second inclined surface 32, the light incident part 40a of the lens 40 may be finely aligned to balance forces of other light incident parts 40a that are disposed at a side opposite to the light incident part 40a.

For example, when the light incident part 40a disposed at one side of the lens 40 enters into the second inclined surface 32, the light incident parts 40a disposed at the other side of the lens 40 may also enter into the second inclined surface 32 to balance the forces therebetween.

That is, the first inclined surface 31 may align a macroscopic position of the lens 40, and the second inclined surface 32 may finely align the lens 40 to balance the lens 40.

Then, as illustrated in FIG. 30, the light incident part 40a of the lens 40 may finally contact the contact surface 33 and be guided along the contact surface 33. Then, when the bottom surface of the light incident part 40a reaches the substrate 10, and the encapsulation material 30 is completely inserted into the light incident part 40a of the lens 40, the lens 40 may be aligned in a proper position.

Thus, the encapsulation material 30 may be completely inserted into the light incident part 40a of the lens 40 to realize slimness of the product. Also, the lens 40 may be easily aligned by using the guide member 30-1 and be improved in assembly accuracy to prevent luminance and color deviations of a display device, improve light characteristics, and produce high-quality products. In addition, since the lens 40 is aligned in multi-stages by using the first inclined surface 31, the second inclined surface 32, the contact surface 33, and the substrate 10, the damage of the lens 40 may be prevented, and alignment accuracy of the lens 40 may be improved.

Figure 31:
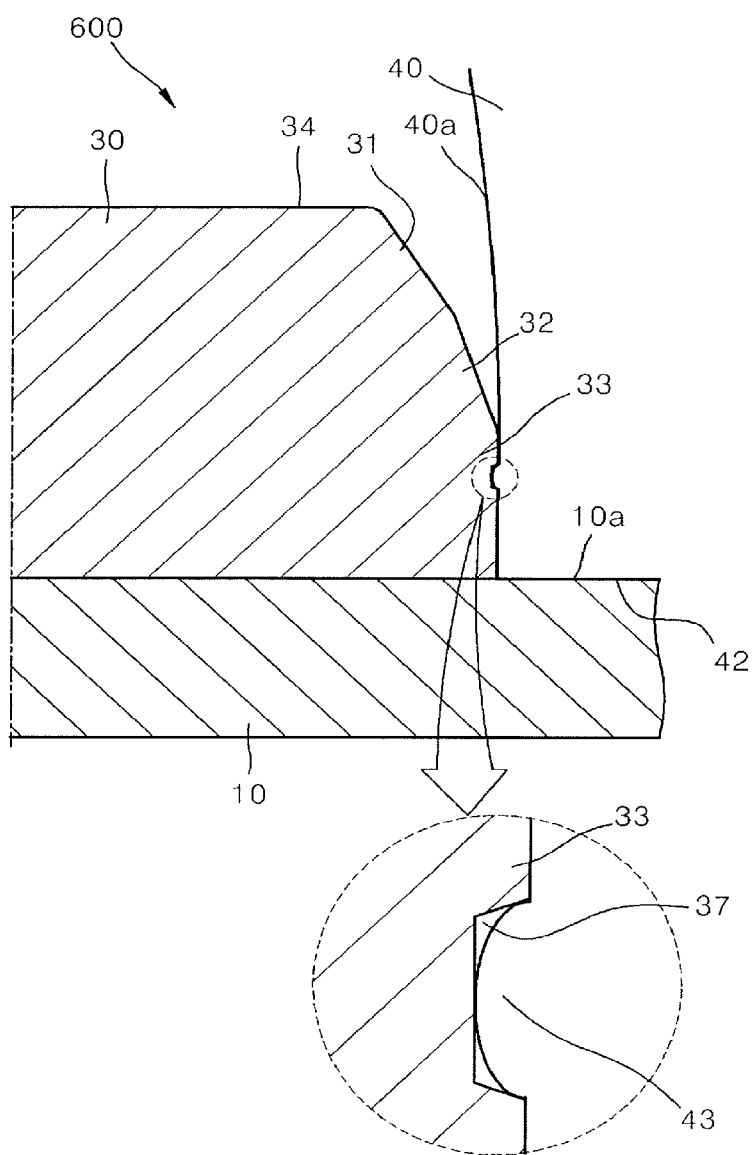
FIG. 31 is a cross-sectional view of a light emitting device package in accordance with an embodiment or another embodiment.

FIG. 31 is a cross-sectional view of a light emitting device package 600 in accordance with an embodiment or another embodiment.

Referring to FIG. 31, a light emitting device package 600 in accordance with an embodiment or another embodiment may further include a hook surface 57 disposed on the contact surface 33 so that the hook surface 57 is engaged with a hook part 43 disposed on a light incident part 40a of a lens 40.

Thus, the light incident part 40a of the lens 40 is hooked on the hook surface 57 to more firmly couple the lens 40 to an encapsulation material 30. Also, it may easily confirm the state in which the lens 40 and the encapsulation material 30 are completely aligned with each other by using the "clack" feel or sound when the lens 40 and the encapsulation material 30 are assembled with each other.

Here, although the hook part 43 and the hook surface 57 are respectively disposed on the light incident part 40a of the lens 40 and the contact surface 33, the present disclosure is not limited thereto. For example, the hook part 43 and the hook surface 57 may be disposed on the contact surface 33 and the light incident part 40a of the lens 40, respectively.

Also, although not shown, a phosphor may be disposed around a light emitting device 20.

Figure 32:
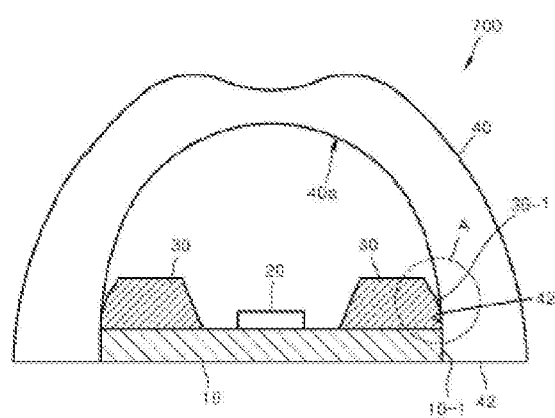
FIG. 32 is a cross-sectional view of a light emitting device package in accordance with an embodiment or another embodiment.

FIG. 32 is a cross-sectional view of a light emitting device package 700 in accordance with an embodiment or another embodiment.

As illustrated in FIG. 32, the light emitting device package 700 in accordance with an embodiment or another embodiment may further include the encapsulation material 30 and the guide member 30-1, which are described above. Also, the light emitting device package 700 may further include a substrate 10 on which a light emitting device 20 is seated to support the encapsulation material 30 and at least one substrate guide part 10-1 disposed on a side surface of the substrate 10 to guide an assembly path of a lens 40. A bottom surface 42 of the lens 40 may be disposed at a same level as a bottom surface of the substrate 10.

Here, the substrate 10 may also have a substantially circular or quadrangular plate shape with rounded corners, like the encapsulation material 30. The substrate guide part 10-1 may be a side surface that is completely inserted into a light incident part 40a of the lens 40 and is engaged with an inner engaging surface 42' of the lens 40 (as shown in a dotted area A).

Also, the substrate guide part 10-1 may have the same size as the guide member 30-1. Also, the substrate guide part 10-1 together with the encapsulation material 30 may be completely inserted into the light incident part 40a of the lens 40. Although not shown, the hook surface 57 of FIG. 31 corresponding to the hook part 43 disposed on the light incident part 40a of the lens 40 may also be disposed on the substrate guide part 10-1.

Thus, the encapsulation material 30 and the substrate 10 may be completely inserted (snap-fitted) into the light incident part 40a of the lens 40 to realize slimmer products.

Figure 33:
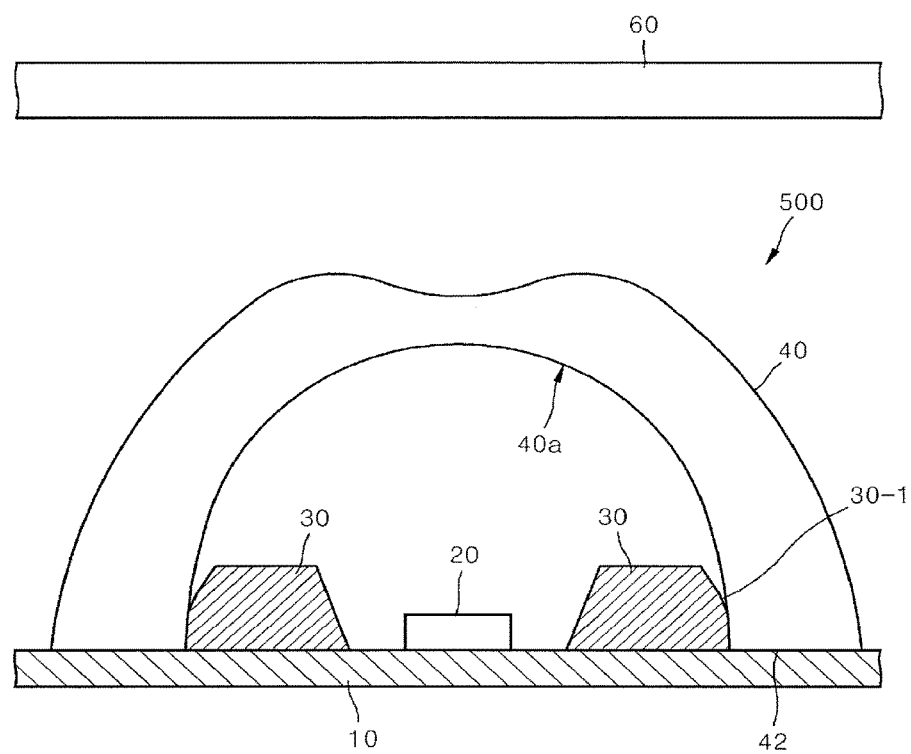
FIG. 33 is a cross-sectional view of a backlight unit in accordance with an embodiment or another embodiment.

FIG. 33 is a cross-sectional view of a backlight unit in accordance with an embodiment or another embodiment.

Referring to FIG. 33, a backlight unit in accordance with an embodiment or another embodiment may largely include a substrate 10, a light emitting device 20, an encapsulation material 30, a guide member 30-1, and a light guide plate 60.

Here, the backlight unit may be disposed on an LCD panel to transmit light toward the LCD panel. The light emitting device 20, the encapsulation material 30, and the guide member 30-1 may have the same constitution and effect as those described with reference to FIGS. 23 to 26.

The light guide plate 60 may be disposed in a path of light emitted from the light emitting device 20 to transmit the light emitted from the light emitting device 20 into a wider area. The light guide plate 60 may be formed of a polycarbonate-based resin, a polysulfone-based resin, a polyacrylate-based resin, a polystyrene-based resin, a polyvinyl chloride-based resin, a polyvinyl alcohol-based resin, a polynorbornene-based resin, or a polyester-based resin. In addition, the light guide plate 60 may be formed of various light transmission resin materials. Also, a fine pattern, a fine protrusion, or a diffusion layer may be formed on a surface of the light guide plate 60, or microbubbles may be formed in the light guide plate 60.

The backlight unit in accordance with an embodiment or another embodiment may be a direct-type backlight unit in which the light emitting device 20 is disposed under the light guide plate 60.

According to the embodiments of the present disclosure as described above, the light characteristics may be improved to prevent product defects from occurring when assembled with the lens, and the lens may be aligned in multi-stages to prevent the lens from being damaged when the lens is aligned. Also, it may prevent the lens having various shapes from being misaligned, and the encapsulation material or the substrate may be completely inserted into the light incident part to realize the slimness of the product. Of cause, the range of the present disclosure is not limited to the above-described effects.

Although the light emitting device package and backlight unit having the same have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A light emitting device package comprising:
   a substrate;
   a light emitting device disposed on the substrate; and
   a guide member disposed on an encapsulation material,
   wherein the guide member comprises:
   a top surface;
   at least one inclined surface to guide a light incident part of a lens, the lens including at least one engaging surface to contact the guide member; and
   a bottom surface configured to contact the encapsulation material,
   the encapsulation material being configured to surround the light emitting device and including a stopper configured to contact the at least one engaging surface of the lens; and
   wherein the at least one inclined surface of the guide member comprises a contact surface including a first inclined surface and a second inclined surface, the first inclined surface being inclined to the top surface, and the second inclined surface being inclined to the first inclined surface and to the top surface.

2. The light emitting device package of claim 1, wherein the guide member further comprises a round edge disposed between the top surface and the first inclined surface.

3. The light emitting device package of claim 1, wherein the bottom surface of the guide member includes an area larger than that of the top surface to contact the encapsulation material.

4. The light emitting device package of claim 1, wherein the at least one engaging surface of the lens includes a bottom engaging surface which is supported by the stopper, and the stopper is disposed to be more distant from a light axis of the light emitting device than the top surface.

5. The light emitting device package of claim 1, wherein the at least one engaging surface of the lens includes an inner engaging surface to contact the guide member, and the inner engaging surface includes an angle of inclination of about 90° with respect to the substrate.

6. The light emitting device package of claim 1, wherein the lens further includes a part fixed to the substrate.

7. The light emitting device package of claim 1, wherein the lens is disposed to be more distant from a light axis of the light emitting device than the guide member.

8. A light emitting device package comprising:
   a substrate;
   a light emitting device disposed on the substrate; and
   a guide member disposed on an encapsulation material,
   wherein the guide member comprises:
   a top surface;
   at least one inclined surface to guide a light incident part of a lens, the lens including a light incident part which is an inner hollow portion, the light incident part having an engaging surface to contact the encapsulation material and the substrate; and
   a bottom surface configured to contact the encapsulation material, the encapsulation material being configured to surround the light emitting device and including a stopper configured to contact the at least one engaging surface of the lens, and
   wherein the at least one inclined surface of the guide member comprises a contact surface including a first inclined surface and a second inclined surface, the first inclined surface being inclined to the top surface, and the second inclined surface being inclined to the first inclined surface and to the top surface.

9. The light emitting device package of claim 8, wherein the engaging surface includes an inner engaging surface of which an angle of inclination is about 90° with respect to the substrate.

10. The light emitting device package of claim 8, wherein the substrate further comprises a side surface engaging with the engaging surface.

11. The light emitting device package of claim 8, wherein the lens further includes a bottom surface disposed at a same level as a bottom surface of the substrate.

12. A light emitting device package comprising:
    a substrate;
    a light emitting device disposed on the substrate;
    a lens including a light incident part which is an inner hollow portion; and
    a guide member disposed on an encapsulation material,
    wherein the guide member includes:
    a top surface;
    at least one inclined surface to guide the light incident part of a lens, the guide member being snap fitted into the light incident part; and
    a bottom surface configured to contact the encapsulation material on the substrate, the encapsulation material being configured to surround the light emitting device and including a stopper configured to contact at least one engaging surface of the lens,
    wherein the at least one inclined surface of the guide member comprises a contact surface including a first inclined surface and a second inclined surface, the first inclined surface being inclined to the top surface, and the second inclined surface being inclined to the first inclined surface and to the top surface.

* * * * *